(12) United States Patent
Janssen et al.

(10) Patent No.: US 10,928,722 B2
(45) Date of Patent: Feb. 23, 2021

(54) METHOD OF MANUFACTURING A MEMBRANE ASSEMBLY FOR EUV LITHOGRAPHY, A MEMBRANE ASSEMBLY, A LITHOGRAPHIC APPARATUS, AND A DEVICE MANUFACTURING METHOD

(71) Applicant: ASML NETHERLANDS B.V., Veldhoven (NL)

(72) Inventors: Paul Janssen, Eindhoven (NL); Johan Hendrik Klootwijk, Eindhoven (NL); Wilhelmus Theodorus Anthonius Johannes Van Den Einden, Deurne (NL); Aleksandar Nikolov Zdravkov, Eindhoven (NL)

(73) Assignee: ASML NETHERLANDS B.V., Veldhoven (NL)

( * ) Notice: Subject to any disclaimer, the term of this patent is extended or adjusted under 35 U.S.C. 154(b) by 258 days.

(21) Appl. No.: 16/062,919

(22) PCT Filed: Dec. 2, 2016

(86) PCT No.: PCT/EP2016/079606
§ 371 (c)(1),
(2) Date: Jun. 15, 2018

(87) PCT Pub. No.: WO2017/102383
PCT Pub. Date: Jun. 22, 2017

(65) Prior Publication Data
US 2018/0373170 A1    Dec. 27, 2018

(30) Foreign Application Priority Data

Dec. 18, 2015  (EP) ..................... 15201073
May 25, 2016  (EP) ..................... 16171233

(51) Int. Cl.
G03F 1/64    (2012.01)
G03F 1/62    (2012.01)

(52) U.S. Cl.
CPC . *G03F 1/64* (2013.01); *G03F 1/62* (2013.01)

(58) Field of Classification Search
CPC .................... G03F 1/62; G03F 1/64
USPC ............................................. 430/5
See application file for complete search history.

(56) References Cited

U.S. PATENT DOCUMENTS

| 6,623,893 B1 | 9/2003 | Levinson et al. |
| 2013/0088699 A1 | 4/2013 | Yakunin et al. |
| 2014/0370423 A1 | 12/2014 | Goldfarb |
| 2015/0168824 A1 | 6/2015 | Sun et al. |
| 2015/0243558 A1 | 8/2015 | Anselm et al. |
| 2015/0277230 A1 | 10/2015 | Mueller et al. |
| 2016/0231647 A1 | 8/2016 | Hsu et al. |
| 2018/0314150 A1 | 11/2018 | Brouns et al. |

FOREIGN PATENT DOCUMENTS

| CN | 103080840 | 5/2013 |
| JP | 9-213620 A | 8/1997 |
| JP | 2010-541267 A | 12/2010 |
| JP | 2012-079853 A | 4/2012 |
| JP | 2014-049677 A | 3/2014 |
| JP | 2014-093511 A | 5/2014 |
| JP | 2018-513395 A | 5/2018 |
| KR | 10-2018-0022273 A | 3/2018 |
| TW | 460697 B | 10/2001 |
| TW | 201443554 A | 11/2014 |
| WO | 2014/154452 A1 | 10/2014 |

OTHER PUBLICATIONS

Chinese Office Action issued in corresponding Chinese Patent Application No. 201680082147.7, dated Jan. 17, 2020.
International Search Report and Written Opinion issued for International Patent Application No. PCT/EP2016/079606, dated Mar. 16, 2017.
Goldfarb, D., "Fabrication of a full-size EUV pellicle based on silicon nitride," Photomask Technology 2015, Proc. of SPIE, vol. 9635, Oct. 23, 2015, 13 pages.
Search Report and Written Opinion issued for Netherlands Patent Application No. 2017915, dated Aug. 16, 2017.
Office Action dated Jul. 23, 2020 issued in corresponding Taiwanese Patent Application No. 105141173 with English translation.
Office Action dated Sep. 14, 2020 issued in corresponding Japanese Patent Application No. 2018-531133.

*Primary Examiner* — Christopher G Young
(74) *Attorney, Agent, or Firm* — Pillsbury Winthrop Shaw Pittman, LLP

(57) ABSTRACT

Methods of manufacturing a membrane assembly where, in one arrangement, a stack includes a planar substrate and at least one membrane layer. The planar substrate includes an inner region, a border region around the inner region, a bridge region around the border region and an edge region around the bridge region. The inner region and a first portion of the bridge region are removed. The membrane assembly after removal has: a membrane formed from the at least one membrane layer, a border holding the membrane, the border formed from the border region, an edge section around the border, the edge section formed from the edge region, a bridge between the border and the edge section, the bridge formed from the at least one membrane layer and a second portion of the bridge region. The method further involves separating the edge section from the border by cutting or breaking the bridge.

20 Claims, 22 Drawing Sheets

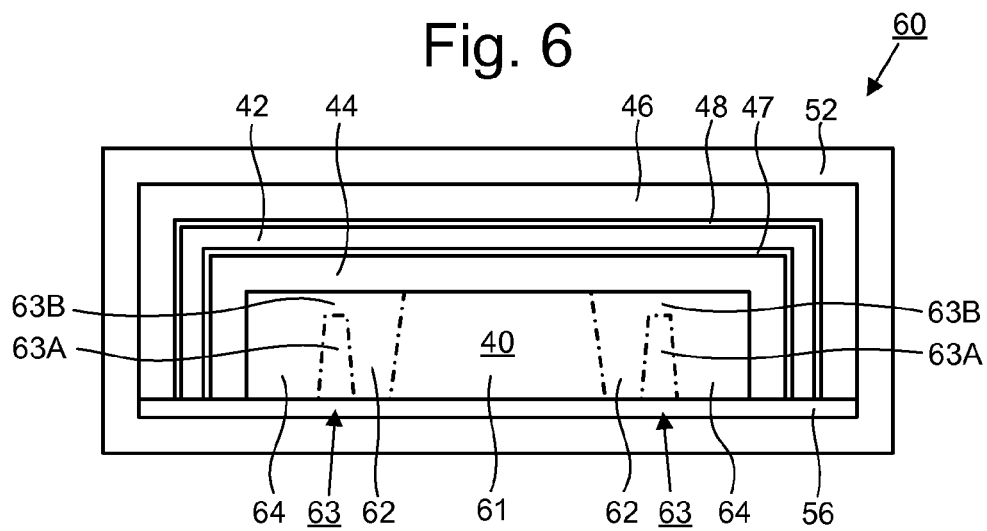
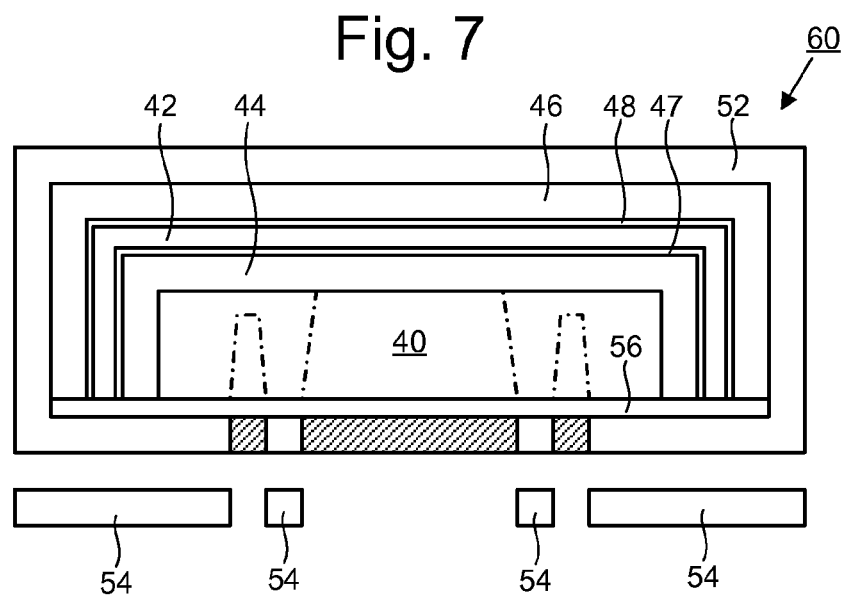
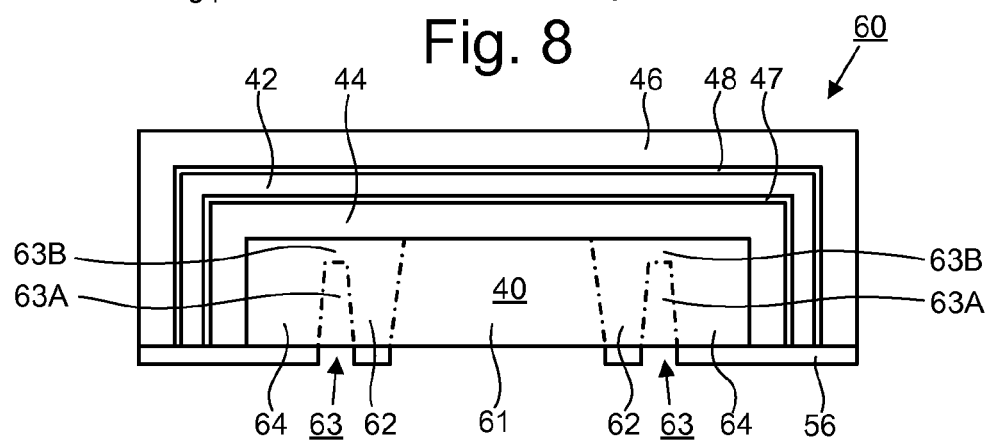

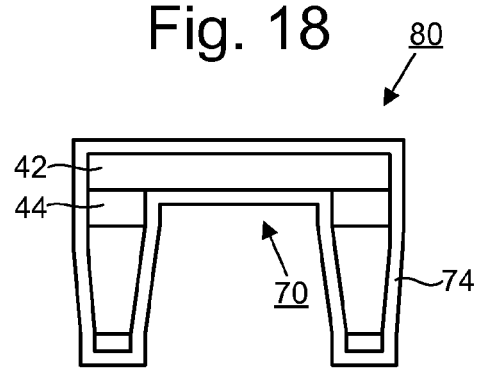
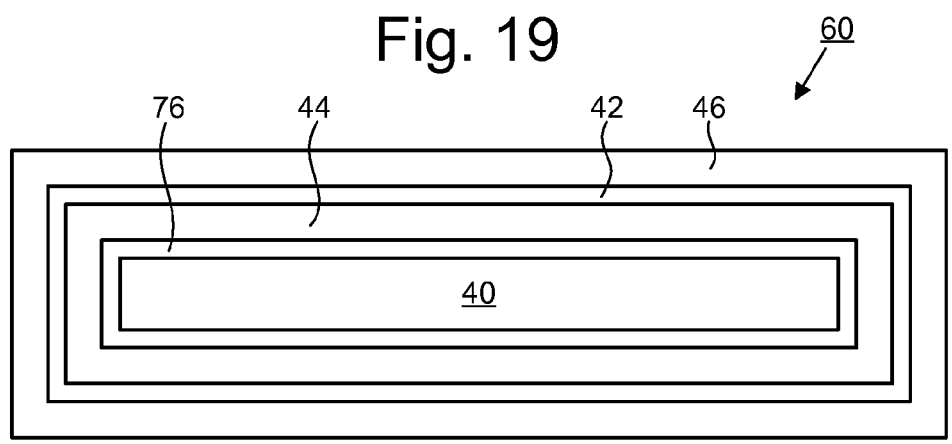
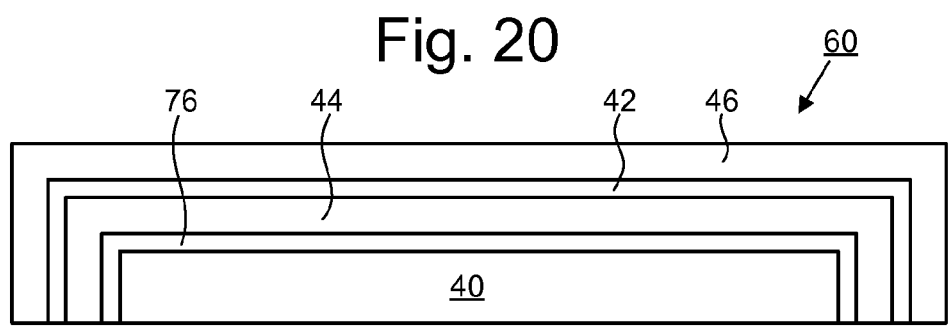

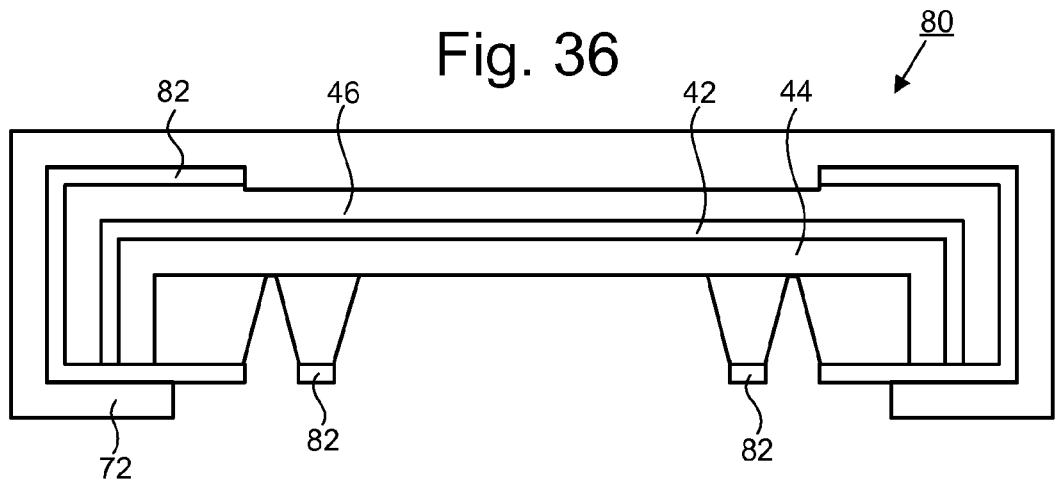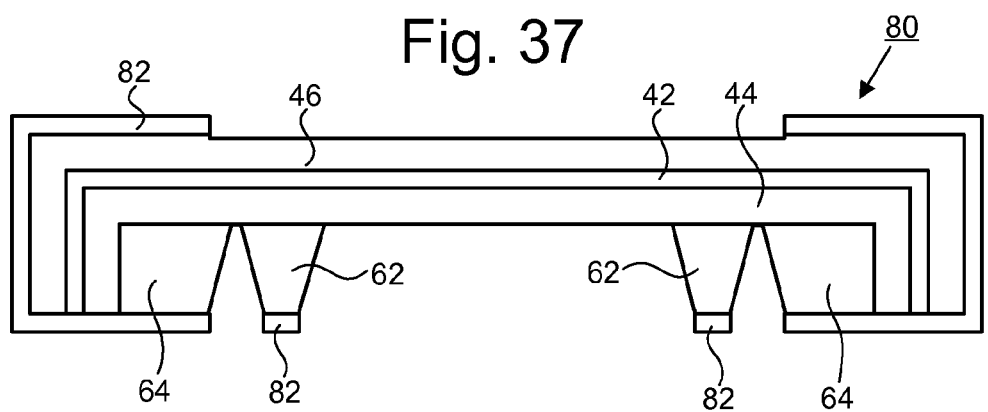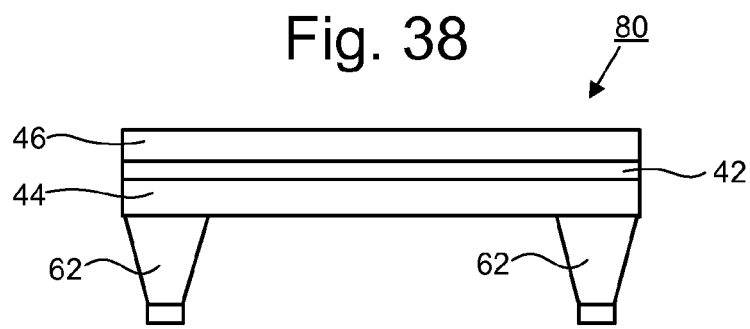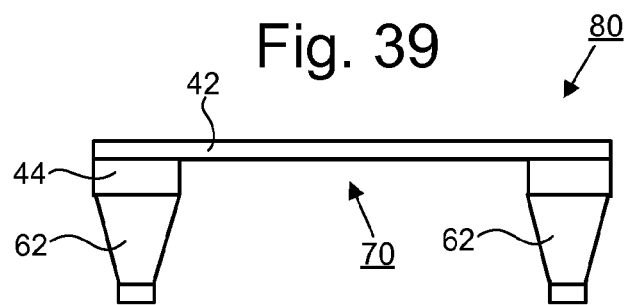

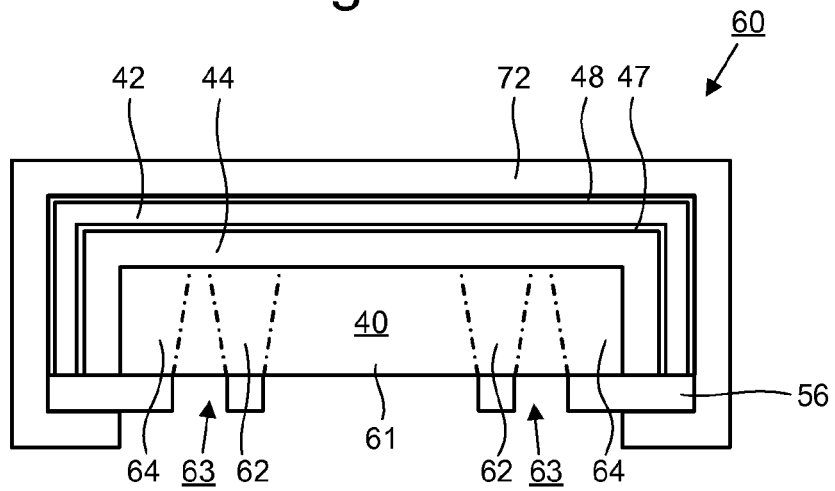
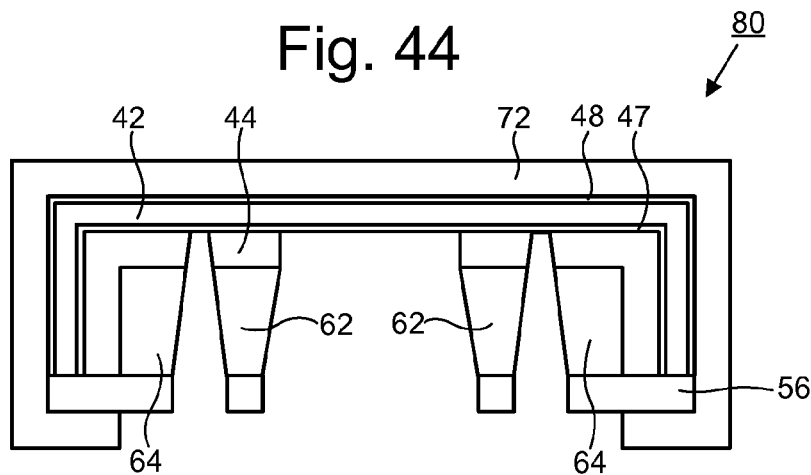
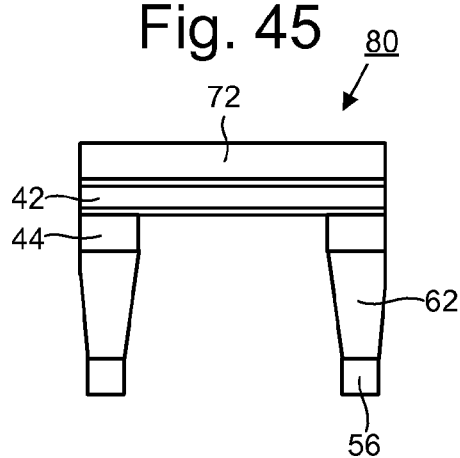
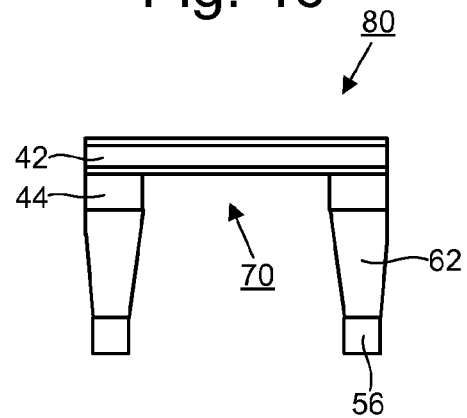

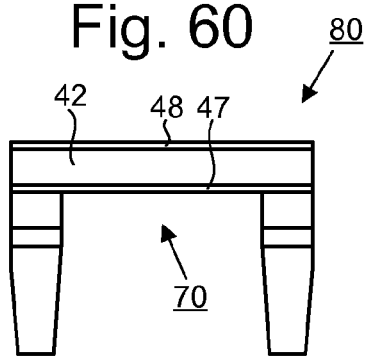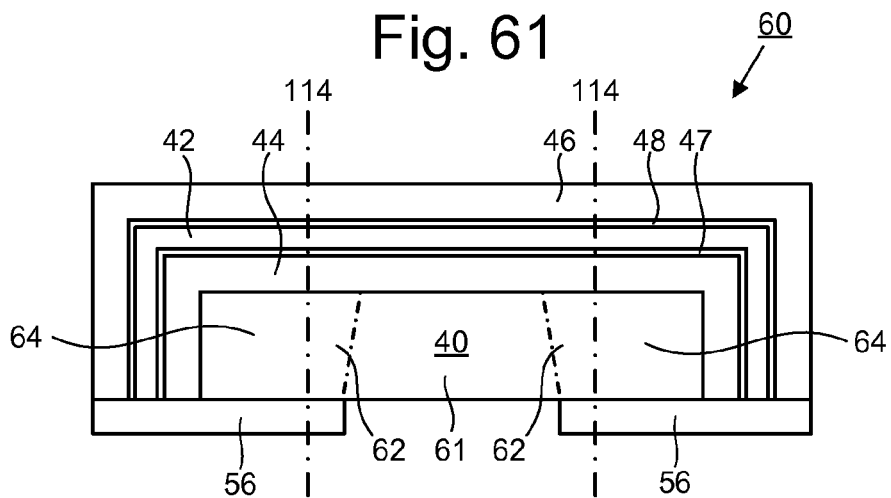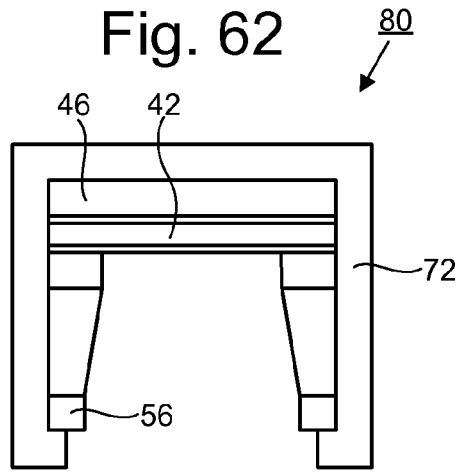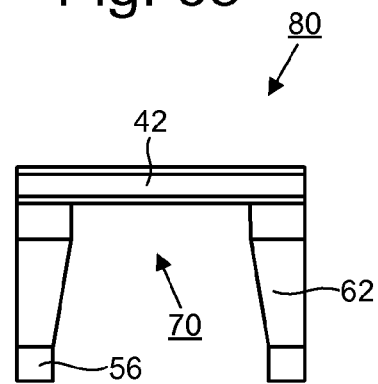

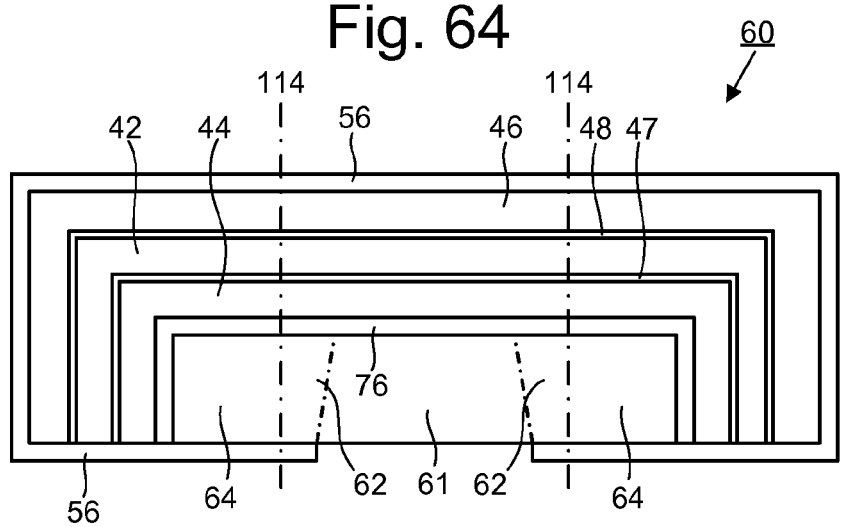
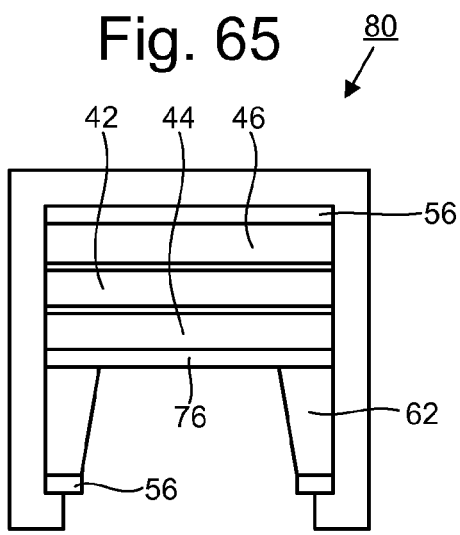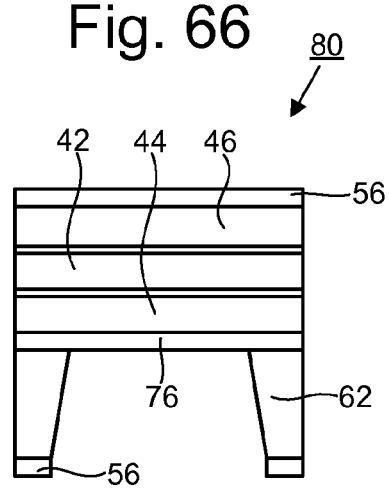
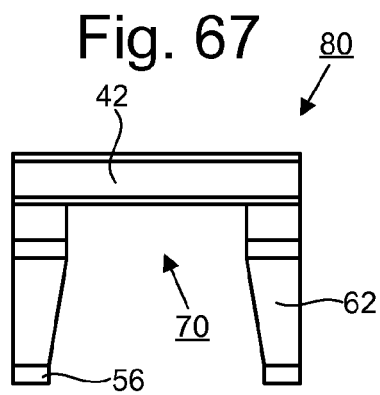

METHOD OF MANUFACTURING A MEMBRANE ASSEMBLY FOR EUV LITHOGRAPHY, A MEMBRANE ASSEMBLY, A LITHOGRAPHIC APPARATUS, AND A DEVICE MANUFACTURING METHOD

CROSS-REFERENCE TO RELATED APPLICATIONS

This application is the U.S. national phase entry of PCT patent application no. PCT/EP2016/079606, which was filed on Dec. 2, 2016, which claims the benefit of priority of European patent application no. 15201073.2, which was filed on Dec. 18, 2015, and European patent application no. 16171233.6, which was filed on May 25 2016, each of which is incorporated herein in its entirety by reference.

FIELD

The present invention relates to a method of manufacturing a membrane assembly for EUV lithography, a membrane assembly, a lithographic apparatus, and a device manufacturing method.

BACKGROUND

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g., comprising part of, one, or several dies) on a substrate (e.g., a silicon wafer). Transfer of the pattern is typically via imaging onto a layer of radiation-sensitive material (resist) provided on the substrate. In general, a single substrate will contain a network of adjacent target portions that are successively patterned.

Lithography is widely recognized as one of the key steps in the manufacture of ICs and other devices and/or structures. However, as the dimensions of features made using lithography become smaller, lithography is becoming a more critical factor for enabling miniature IC or other devices and/or structures to be manufactured.

A theoretical estimate of the limits of pattern printing can be given by the Rayleigh criterion for resolution as shown in equation (1):

$$CD = k_1 * \frac{\lambda}{NA} \quad (1)$$

where $\lambda$ is the wavelength of the radiation used, NA is the numerical aperture of the projection system used to print the pattern, $k_1$ is a process-dependent adjustment factor, also called the Rayleigh constant, and CD is the feature size (or critical dimension) of the printed feature. It follows from equation (1) that reduction of the minimum printable size of features can be obtained in three ways: by shortening the exposure wavelength $\lambda$, by increasing the numerical aperture NA or by decreasing the value of $k_1$.

In order to shorten the exposure wavelength and, thus, reduce the minimum printable size, it has been proposed to use an extreme ultraviolet (EUV) radiation source. EUV radiation is electromagnetic radiation having a wavelength within the range of 10-20 nm, for example within the range of 13-14 nm. It has further been proposed that EUV radiation with a wavelength of less than 10 nm could be used, for example within the range of 5-10 nm such as 6.7 nm or 6.8 nm. Such radiation is termed extreme ultraviolet radiation or soft x-ray radiation. Possible sources include, for example, laser-produced plasma sources, discharge plasma sources, or sources based on synchrotron radiation provided by an electron storage ring.

A lithographic apparatus includes a patterning device (e.g., a mask or a reticle). Radiation is provided through or reflected off the patterning device to form an image on a substrate. A membrane assembly may be provided to protect the patterning device from airborne particles and other forms of contamination. The membrane assembly for protecting the patterning device may be called a pellicle. Contamination on the surface of the patterning device can cause manufacturing defects on the substrate. The membrane assembly may comprise a border and a membrane stretched across the border. It is difficult to manufacture the membrane assembly without the membrane assembly being deformed in the process, for example because of the thinness of the membrane.

It is also difficult to manufacture the membrane assembly without the membrane assembly being damaged or contaminated in the process. For example, the membrane may be undesirably oxidized or have unwanted contaminant particles deposited on the membrane during the process of manufacturing the membrane assembly.

It is desirable to reduce the possibility of a membrane assembly such as a pellicle being deformed, damaged or contaminated during its manufacture.

SUMMARY OF THE INVENTION

According to an aspect of the invention, there is provided a method of manufacturing a membrane assembly for EUV lithography, comprising: providing a stack comprising a planar substrate and at least one membrane layer, wherein the planar substrate comprises an inner region, a border region around the inner region, a bridge region around the border region and an edge region around the bridge region; selectively removing the inner region and a first portion of the bridge region to provide a membrane assembly comprising: a membrane formed from the at least one membrane layer; a border holding the membrane, the border formed from the border region of the planar substrate; an edge section around the border, the edge section formed from the edge region of the planar substrate; and a bridge between the border and the edge section, the bridge formed from the at least one membrane layer and a second portion of the bridge region of the planar substrate; and separating the edge section from the border by cutting or breaking the bridge.

According to an aspect of the invention, there is provided a method of manufacturing a membrane assembly for EUV lithography, comprising: providing a stack comprising a planar substrate and at least one membrane layer, wherein the planar substrate comprises an inner region, a border region around the inner region, a bridge region around the border region and an edge region around the border region; applying a first protection layer over at least a top surface of the stack, such that the at least one membrane layer is between the first protection layer and the planar substrate, and over side surfaces of the stack; applying a first removal process to the stack and first protection layer to selectively remove at least a portion of the bridge region of the planar substrate, thereby thinning or removing an integral connection between the border region and the edge region of the planar substrate, the first protection layer being resistant to the first removal process; removing the edge region and layers formed on the edge region; applying a second protection layer over at least side surfaces of the substrate assembly after removal of the edge region; applying a second removal process to selectively remove the inner region, the second protection layer being resistant to the second removal process, to provide a membrane assembly comprising: a membrane formed from the at least one membrane layer; and a border holding the membrane, the border formed from the border region of the planar substrate.

According to an aspect of the invention, there is provided a method of manufacturing a membrane assembly for EUV lithography, comprising: providing a stack comprising a planar substrate, at least one membrane layer and a protection layer, the at least one membrane layer being between the protection layer and the planar substrate, wherein the planar substrate comprises an inner region, a border region around the inner region, a bridge region around the border region and an edge region around the bridge region; using a removal process to selectively remove the inner region and at least a portion of the bridge region, thereby thinning or removing an integral connection between the border region and the edge region of the planar substrate, the protection layer being resistant to the removal process; and separating the edge region and layers formed on the edge region from the substrate assembly and, subsequently, removing the protection layer, to provide a membrane assembly comprising: a membrane formed from the at least one membrane layer; and a border holding the membrane, the border formed from the border region of the planar substrate.

According to an aspect of the invention, there is provided a method of manufacturing a membrane assembly for EUV lithography, comprising: providing a stack comprising a planar substrate and at least one membrane layer, wherein the planar substrate comprises an inner region, a border region around the inner region, a bridge region around the border region and an edge region around the bridge region; encapsulating the stack with an etch resistant coating and patterning the etch resistant coating on a bottom side of the stack to define regions of the stack that are protected by the etch resistant coating and regions of the stack that are not protected by the etch resistant coating; applying a mechanical polishing process to a region on a top side of the stack above the inner region, border region and bridge region of the planar substrate to remove a first portion of the etch resistant coating; applying an etching process effective to etch the etch resistant coating to the region on the top side of the stack above the inner region, border region and bridge region of the planar substrate to remove a second portion of the etch resistant coating; applying a protection layer covering at least the top side of the stack; and using a removal process to selectively remove the inner region and at least a portion of the bridge region, thereby thinning or removing an integral connection between the border region and the edge region of the planar substrate, to provide a membrane assembly comprising: a membrane formed from the at least one membrane layer; a border holding the membrane, the border formed from the border region of the planar substrate; an edge section around the border, the edge section formed from the edge region of the planar substrate; and a bridge between the border and the edge section, the bridge formed from the at least one membrane layer and any remaining portion of the bridge region of the planar substrate; and separating the edge section from the border by cutting or breaking the bridge.

According to an aspect of the invention, there is provided a method of manufacturing a membrane assembly for EUV lithography, comprising: providing a stack comprising a planar substrate and at least one membrane layer, wherein the planar substrate comprises an inner region, a border region around the inner region, and an edge region around the border region; removing the edge region and layers formed on the edge region; applying a protection layer over at least a top surface of the stack, such that the at least one membrane layer is between the protection layer and the planar substrate, and over side surfaces of the stack; using a first removal process to selectively remove the inner region, the protection layer being resistant to the first removal process; and using a second removal process to remove the protection layer, to provide a membrane assembly comprising: a membrane formed from the at least one membrane layer; and a border holding the membrane, the border formed from the border region of the planar substrate.

BRIEF DESCRIPTION OF THE DRAWINGS

Embodiments of the invention will now be described, by way of example only, with reference to the accompanying schematic drawings in which corresponding reference symbols indicate corresponding parts, and in which:

FIGS. 3 to 10 schematically depict stages in a method of manufacturing a membrane assembly in which a bridge region of a substrate is only partially etched through prior to separation of an edge region of the planar substrate;

FIG. 18 schematically depicts a membrane assembly covered by a capping layer formed according to an alternative embodiment;

FIGS. 19 to 23 schematically depict stages in a method of manufacturing a membrane assembly in which plural membrane assemblies are formed from a single planar substrate, prior to separation of individual membrane assemblies;

FIGS. 34 to 39 show stages in a method of manufacturing a membrane assembly in which a polishing process is applied to a top surface to remove debris or flakes;

FIG. 43-46 schematically depict example processing for manufacturing a membrane assembly 80 in which all of the bridge region 63 is removed;

FIGS. 54 to 60 schematically depict further alternative example processing for manufacturing a membrane assembly in which a protection layer 72 is removed prior to separation;

FIGS. 61-63 schematically depict example processing for manufacturing a membrane assembly in which a stack is diced prior to removal of an inner region of the planar substrate;

FIG. 64-67 schematically depict alternative example processing for manufacturing a membrane assembly in which a stack is diced prior to removal of an inner region of the planar substrate;

Figure 1:
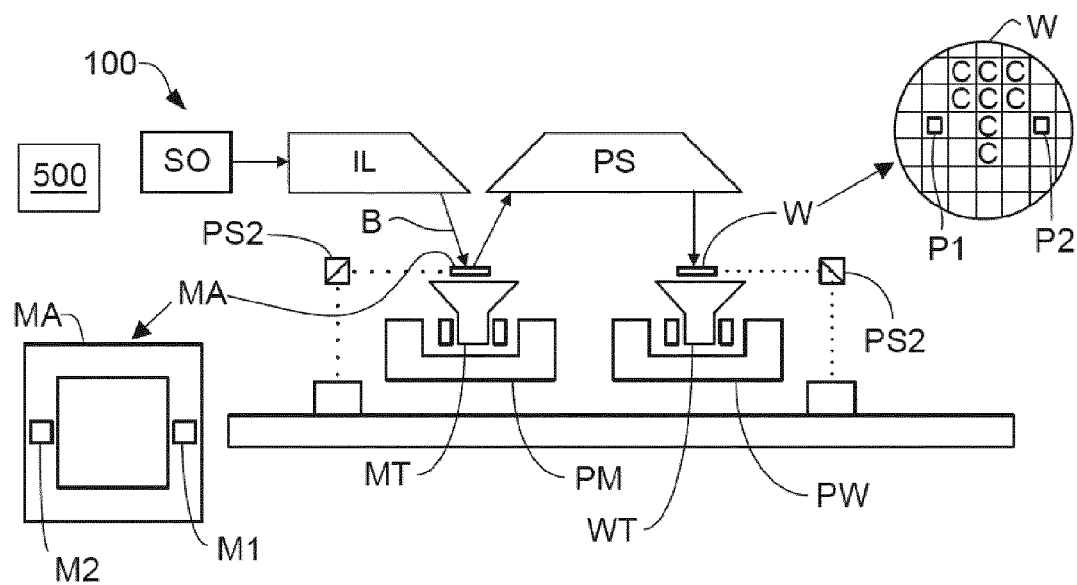
FIG. 1 depicts a lithographic apparatus according to an embodiment of the invention.

The features and advantages of the present invention will become more apparent from the detailed description set forth below when taken in conjunction with the drawings, in which like reference characters identify corresponding elements throughout. In the drawings, like reference numbers generally indicate identical, functionally similar, and/or structurally similar elements.

DETAILED DESCRIPTION

FIG. 1 schematically depicts a lithographic apparatus 100 including a source collector module SO according to one embodiment of the invention. The apparatus 100 comprises:

an illumination system (or illuminator) IL configured to condition a radiation beam B (e.g., EUV radiation).

a support structure (e.g., a mask table) MT constructed to support a patterning device (e.g., a mask or a reticle) MA and connected to a first positioner PM configured to accurately position the patterning device;

a substrate table (e.g., a wafer table) WT constructed to hold a substrate (e.g., a resist-coated wafer) W and connected to a second positioner PW configured to accurately position the substrate; and a projection system (e.g., a reflective projection system) PS configured to project a pattern imparted to the radiation beam B by patterning device MA onto a target portion C (e.g., comprising one or more dies) of the substrate W.

The illumination system IL may include various types of optical components, such as refractive, reflective, magnetic, electromagnetic, electrostatic or other types of optical components, or any combination thereof, for directing, shaping, or controlling radiation.

The support structure MT holds the patterning device MA in a manner that depends on the orientation of the patterning device, the design of the lithographic apparatus, and other conditions, such as for example whether or not the patterning device is held in a vacuum environment. The support structure MT can use mechanical, vacuum, electrostatic or other clamping techniques to hold the patterning device MA.

The support structure MT may be a frame or a table, for example, which may be fixed or movable as required. The support structure MT may ensure that the patterning device MA is at a desired position, for example with respect to the projection system PS.

The term "patterning device" should be broadly interpreted as referring to any device that can be used to impart a radiation beam B with a pattern in its cross-section such as to create a pattern in a target portion C of the substrate W. The pattern imparted to the radiation beam B may correspond to a particular functional layer in a device being created in the target portion C, such as an integrated circuit.

The patterning device MA may be transmissive or reflective. Examples of patterning devices include masks, programmable mirror arrays, and programmable liquid-crystal display (LCD) panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam, which is reflected by the mirror matrix.

The projection system PS, like the illumination system IL, may include various types of optical components, such as refractive, reflective, magnetic, electromagnetic, electrostatic or other types of optical components, or any combination thereof, as appropriate for the exposure radiation being used, or for other factors such as the use of a vacuum. It may be desired to use a vacuum for EUV radiation since other gases may absorb too much radiation. A vacuum environment may therefore be provided to the whole beam path with the aid of a vacuum wall and vacuum pumps.

As here depicted, the lithographic apparatus 100 is of a reflective type (e.g., employing a reflective mask).

The lithographic apparatus 100 may be of a type having two (dual stage) or more substrate tables WT (and/or two or more support structures MT). In such a "multiple stage" lithographic apparatus the additional substrate tables WT (and/or the additional support structures MT) may be used in parallel, or preparatory steps may be carried out on one or more substrate tables WT (and/or one or more support structures MT) while one or more other substrate tables WT (and/or one or more other support structures MT) are being used for exposure.

Referring to FIG. 1, the illumination system IL receives an extreme ultraviolet radiation beam from the source collector module SO. Methods to produce EUV light include, but are not necessarily limited to, converting a material into a plasma state that has at least one element, e.g., xenon, lithium or tin, with one or more emission lines in the EUV range. In one such method, often termed laser produced plasma ("LPP") the required plasma can be produced by irradiating a fuel, such as a droplet, stream or cluster of material having the required line-emitting element, with a laser beam. The source collector module SO may be part of an EUV radiation system including a laser, not shown in FIG. 1, for providing the laser beam exciting the fuel. The resulting plasma emits output radiation, e.g., EUV radiation, which is collected using a radiation collector, disposed in the source collector module. The laser and the source collector module SO may be separate entities, for example when a $CO_2$ laser is used to provide the laser beam for fuel excitation.

In such cases, the laser is not considered to form part of the lithographic apparatus 100 and the radiation beam B is passed from the laser to the source collector module SO with the aid of a beam delivery system comprising, for example, suitable directing mirrors and/or a beam expander. In other cases the source may be an integral part of the source collector module SO, for example when the source is a discharge produced plasma EUV generator, often termed as a DPP source.

The illumination system IL may comprise an adjuster for adjusting the angular intensity distribution of the radiation beam. Generally, at least the outer and/or inner radial extent (commonly referred to as σ-outer and σ-inner, respectively) of the intensity distribution in a pupil plane of the illumination system IL can be adjusted. In addition, the illumination system IL may comprise various other components, such as facetted field and pupil mirror devices. The illumination system IL may be used to condition the radiation beam B, to have a desired uniformity and intensity distribution in its cross-section.

The radiation beam B is incident on the patterning device (e.g., mask) MA, which is held on the support structure (e.g., mask table) MT, and is patterned by the patterning device MA. After being reflected from the patterning device (e.g., mask) MA, the radiation beam B passes through the projection system PS, which focuses the radiation beam B onto a target portion C of the substrate W. With the aid of the second positioner PW and position sensor PS2 (e.g., an interferometric device, linear encoder or capacitive sensor), the substrate table WT can be moved accurately, e.g., so as to position different target portions C in the path of the radiation beam B. Similarly, the first positioner PM and another position sensor PS1 can be used to accurately position the patterning device (e.g., mask) MA with respect to the path of the radiation beam B. The patterning device (e.g., mask) MA and the substrate W may be aligned using mask alignment marks M1, M2 and substrate alignment marks P1, P2.

A controller 500 controls the overall operations of the lithographic apparatus 100 and in particular performs an operation process described further below. Controller 500 can be embodied as a suitably-programmed general purpose computer comprising a central processing unit, volatile and non-volatile storage means, one or more input and output devices such as a keyboard and screen, one or more network connections and one or more interfaces to the various parts of the lithographic apparatus 100. It will be appreciated that a one-to-one relationship between controlling computer and lithographic apparatus 100 is not necessary. In an embodiment of the invention one computer can control multiple lithographic apparatuses 100. In an embodiment of the invention, multiple networked computers can be used to control one lithographic apparatus 100. The controller 500 may also be configured to control one or more associated process devices and substrate handling devices in a lithocell or cluster of which the lithographic apparatus 100 forms a part. The controller 500 can also be configured to be subordinate to a supervisory control system of a lithocell or cluster and/or an overall control system of a fab.

Figure 2:
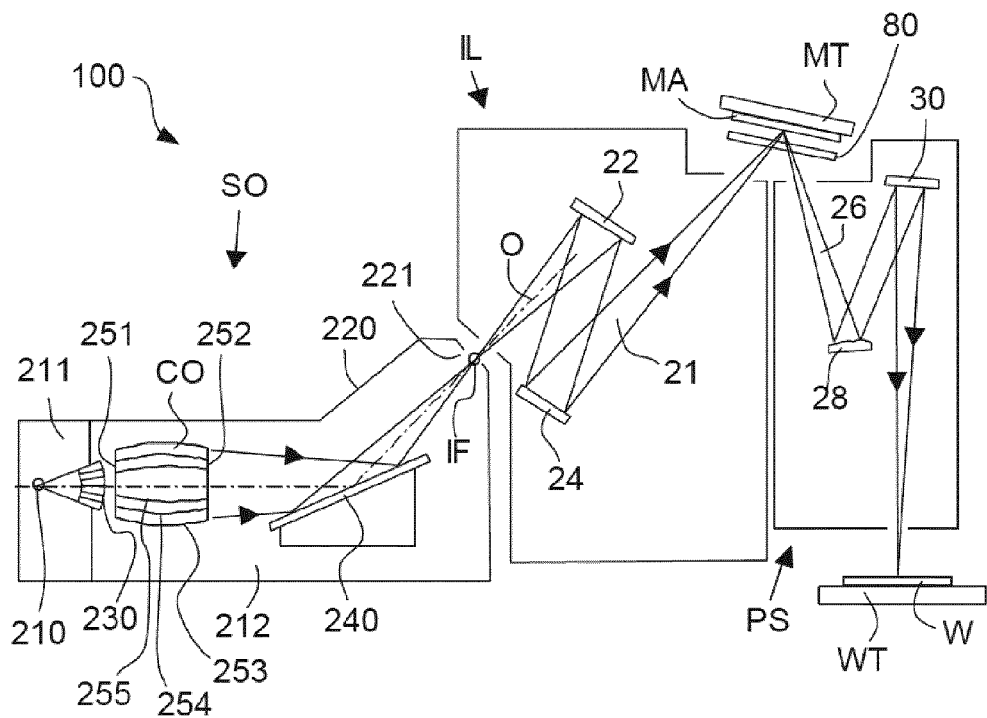
FIG. 2 is a more detailed view of the lithographic apparatus.

FIG. 2 shows the lithographic apparatus 100 in more detail, including the source collector module SO, the illumination system IL, and the projection system PS. An EUV radiation emitting plasma 210 may be formed by a plasma source. EUV radiation may be produced by a gas or vapor, for example Xe gas, Li vapor or Sn vapor in which the radiation emitting plasma 210 is created to emit radiation in the EUV range of the electromagnetic spectrum. In an embodiment, a plasma of excited tin (Sn) is provided to produce EUV radiation.

The radiation emitted by the radiation emitting plasma 210 is passed from a source chamber 211 into a collector chamber 212.

The collector chamber 212 may include a radiation collector CO. Radiation that traverses the radiation collector CO can be focused in a virtual source point IF. The virtual source point IF is commonly referred to as the intermediate focus, and the source collector module SO is arranged such that the virtual source point IF is located at or near an opening 221 in the enclosing structure 220. The virtual source point IF is an image of the radiation emitting plasma 210.

Subsequently the radiation traverses the illumination system IL, which may include a facetted field mirror device 22 and a facetted pupil mirror device 24 arranged to provide a desired angular distribution of the unpatterned beam 21, at the patterning device MA, as well as a desired uniformity of radiation intensity at the patterning device MA. Upon reflection of the unpatterned beam 21 at the patterning device MA, held by the support structure MT, a patterned beam 26 is formed and the patterned beam 26 is imaged by the projection system PS via reflective elements 28, 30 onto a substrate W held by the substrate table WT.

More elements than shown may generally be present in the illumination system IL and the projection system PS. Further, there may be more mirrors present than those shown in the Figures, for example there may be 1-6 additional reflective elements present in the projection system PS than shown in FIG. 2.

Alternatively, the source collector module SO may be part of an LPP radiation system.

As depicted in FIG. 1, in an embodiment the lithographic apparatus 100 comprises an illumination system IL and a projection system PS. The illumination system IL is configured to emit a radiation beam B. The projection system PS is separated from the substrate table WT by an intervening space. The projection system PS is configured to project a pattern imparted to the radiation beam B onto the substrate W. The pattern is for EUV radiation of the radiation beam B.

The space intervening between the projection system PS and the substrate table WT can be at least partially evacuated. The intervening space may be delimited at the location of the projection system PS by a solid surface from which the employed radiation is directed toward the substrate table WT.

In an embodiment the lithographic apparatus 100 comprises a dynamic gas lock. The dynamic gas lock comprises a membrane assembly 80. In an embodiment the dynamic gas lock comprises a hollow part covered by a membrane assembly 80 located in the intervening space. The hollow part is situated around the path of the radiation. In an embodiment the lithographic apparatus 100 comprises a gas blower configured to flush the inside of the hollow part with a flow of gas. The radiation travels through the membrane assembly 80 before impinging on the substrate W.

In an embodiment the lithographic apparatus 100 comprises a membrane assembly 80. As explained above, in an embodiment the membrane assembly 80 is for a dynamic gas lock. In this case the membrane assembly 80 functions as a filter for filtering DUV radiation. Additionally or alternatively, in an embodiment the membrane assembly 80 is a pellicle for the patterning device MA for EUV lithography. The membrane assembly 80 of the present invention can be used for a dynamic gas lock or for a pellicle or for another purpose. In an embodiment the membrane assembly 80 comprises a membrane layer 42 configured to transmit at least 80% of incident EUV radiation.

In an embodiment the pellicle is configured to seal off the patterning device MA to protect the patterning device MA from airborne particles and other forms of contamination. Contamination on the surface of the patterning device MA can cause manufacturing defects on the substrate W. For example, in an embodiment the pellicle is configured to reduce the likelihood that particles might migrate into a stepping field of the patterning device MA in the lithographic apparatus 100.

If the patterning device MA is left unprotected, the contamination can require the patterning device MA to be cleaned or discarded. Cleaning the patterning device MA interrupts valuable manufacturing time and discarding the patterning device MA is costly. Replacing the patterning device MA also interrupts valuable manufacturing time.

Figure 3:
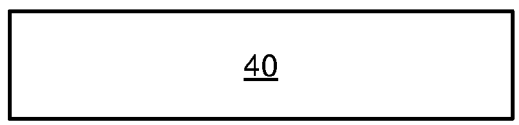
Figure 4:
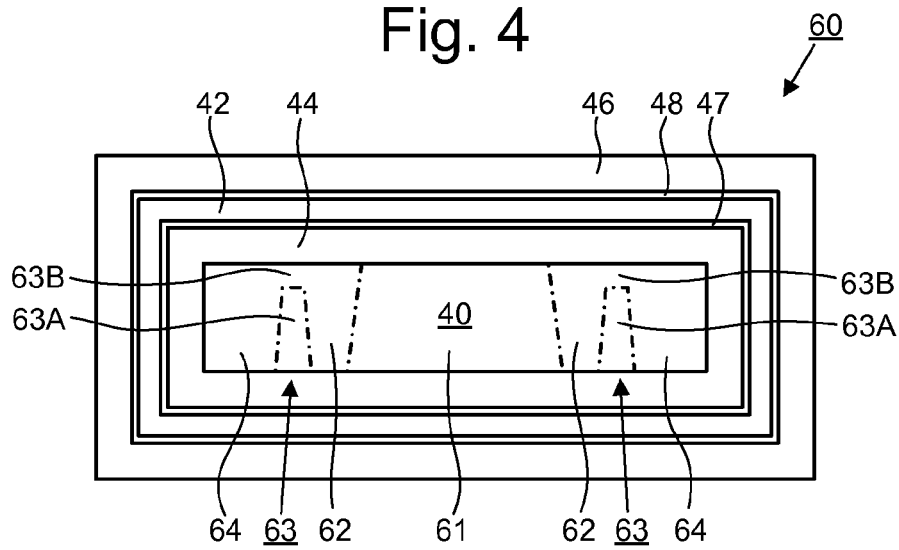

In an embodiment a method of manufacturing a membrane assembly 80 for EUV is provided. Specific examples of methods of this embodiment are described below with reference to FIGS. 1 to 26, 40 to 42, 51 to 60, and 71-73. The method comprises providing a stack 60. The stack 60 comprises a planar substrate 40 and at least one membrane layer 42. The stack 60 may be formed starting from a bare silicon wafer as the planar substrate 40 (as shown in FIG. 3). Layers of the stack 60 are formed or deposited on the planar substrate 40 in subsequent steps. An example stack 60 formed in this way is shown in FIG. 4.

The planar substrate 40 has a shape such as a square, a circle or a rectangle, for example. The shape of the planar substrate 40 is not particularly limited. The size of the planar substrate 40 is not particularly limited. For example, in an embodiment the planar substrate 40 has a diameter in the range of from about 100 mm to about 500 mm, for example about 200 mm. The thickness of the planar substrate 40 is not particularly limited. For example, in an embodiment the planar substrate 40 has a thickness of at least 300 µm, optionally at least 400 µm. In an embodiment the planar substrate 40 has a thickness of at most 1,000 µm, optionally at most 800 µm. In an embodiment the planar substrate 40 has a thickness of about 725 µm. In an embodiment the planar substrate 40 has a thickness of at most 600 µm, optionally at most 400 µm. By providing a thinner planar substrate 40, the amount of the planar substrate 40 that needs to be selectively removed is reduced.

Silicon can crystallize in a diamond cubic crystal structure. In an embodiment the planar substrate 40 comprises a cubic crystal of silicon. In an embodiment the planar substrate 40 has a <100> crystallographic direction.

In an embodiment the planar substrate 40 is polished. The stack 60 has a top side and a bottom side. The top side is depicted at the top of the stack 60 in the Figures. The bottom side is depicted at the bottom of the stack 60 in the Figures.

In an embodiment the planar substrate 40 comprises an oxidized layer. The oxidized layer is part of the planar substrate 40. The rest of the planar substrate 40 forms a non-oxidized layer of the planar substrate 40. The oxidized layer is a sacrificial layer. The oxidized layer forms an etch barrier when the non-oxidized layer of the planar substrate 40 is etched.

In an embodiment the oxidized layer has a thickness greater than 100 nm, optionally greater than 200 nm, and optionally greater than 300 nm. For example, in an embodiment the oxidized layer has a thickness of about 300 nm, 350 nm or about 400 nm.

In an embodiment the oxidized layer is formed as a thin layer of oxide on outer surfaces of the planar substrate 40. In an embodiment the oxidized layer is formed by a thermal oxidation process, for example as a thermal wet oxide. In an embodiment the oxidized layer and the etchant used for etching the planar substrate 40 are configured such that the etch rate of the oxidized layer in the etchant is less than about 5 nm/minute, for example about 3 nm/minute. In an embodiment the oxidized layer comprises amorphous silicon dioxide.

The stack 60 comprises at least one membrane layer 42. The membrane assembly 80 comprises a membrane formed from the at least one membrane layer 42. In an embodiment the at least one membrane layer 42 comprises silicon in one of its allotrope forms such as amorphous, monocrystalline, polycrystalline or nanocrystalline silicon. A nanocrystalline silicon means a polycrystalline silicon matrix containing a certain amorphous silicon content. In an embodiment polycrystalline or nanocrystalline silicon is formed by crystallizing amorphous silicon in the at least one membrane layer 42. For example, a membrane layer 42 is added to the stack 60 as an amorphous silicon layer. The amorphous silicon layer crystallizes into a polycrystalline or nanocrystalline silicon layer when a certain temperature is exceeded. For example, the membrane layer 42 as an amorphous silicon layer transforms into a membrane layer 42 as a polycrystalline or nanocrystalline silicon layer.

In an embodiment the amorphous silicon layer is in-situ doped during its growth. By adding a p- or n-type dopant the silicon conductivity increases, which has a positive effect on handling the power of the EUV source.

In an embodiment the at least one membrane layer 42 is applied to both the top surface and the bottom surface of the stack 60. The at least one membrane layer 42 can be removed from the bottom side of the stack 60 in a later process step. However, this is not necessarily the case. In an alternative embodiment the at least one membrane layer 42 is applied only to the top side of the stack 60. The at least one membrane layer 42 at the top side of the stack 40 becomes the at least one membrane layer 42 in the membrane 70 of the membrane assembly 80 produced by the manufacturing method.

In an embodiment the at least one membrane layer 42 is applied to the stack 60 by a chemical vapor deposition method, for example low pressure chemical vapor deposition (LPCVD) or plasma-enhanced chemical vapor deposition (PECVD). LPCVD produces layers of relatively high quality while PECVD can desirably be effected at lower temperatures. For example, in an embodiment the at least one membrane layer 42 is applied by low pressure chemical vapor deposition (LPCVD) at a temperature in the range of about 500 to 620° C., for example at about 560° C. However, other methods such as PECVD, a sputtering method and a thin filming method can be used.

In an embodiment the at least one membrane layer 42 is thin enough that its transmission for EUV radiation is sufficiently high, for example greater than 50%. In an embodiment the thickness of the at least one membrane layer 42 is at most about 200 nm, and optionally at most about 150 nm. A 150 nm thick pure Si membrane would transmit about 77% of incident EUV radiation. In an embodiment the thickness of the at least one membrane layer 42 is at most about 100 nm. A 100 nm thick pure Si membrane would transmit about 84% of incident EUV radiation.

In an embodiment the at least one membrane layer 42 is thick enough that it is mechanically stable when the membrane assembly 80 is fixed to the patterning device MA of the lithographic apparatus 100 and during use of the lithographic apparatus 100. In an embodiment the thickness of the at least one membrane layer 42 is at least about 10 nm, optionally at least about 20 nm, and optionally at least about 35 nm. In an embodiment the thickness of the at least one membrane layer 42 is about 40 nm.

As depicted for example in FIGS. 4-17, 40-42, 51-60, and 71-73, in an embodiment the stack 60 comprises a lower capping film 47. The lower capping film 47 is disposed between the planar substrate 40 and the at least one membrane layer 42. Optionally the lower capping film 47 is in contact with the at least one membrane layer 42. In an embodiment the lower capping film 47 forms part of the membrane 70 of the membrane assembly 80 produced by the method.

As depicted for example in FIGS. 4-17, 40-42, 51-60, and 71-73, in an embodiment the stack 60 comprises an upper capping film 48. The upper capping film 48 is disposed above the at least one membrane layer 42. Optionally the upper capping film 48 is in contact with the at least one membrane layer 42. In an embodiment the upper capping film 48 forms part of the membrane 70 of the membrane assembly 80 produced by the method.

During use of the lithographic apparatus 100, it is possible for the membrane assembly 80 to break. When the membrane assembly 80 breaks, the membrane 70 can break up into many particles. In particular, if the at least one membrane layer 42 is formed from a material having a brittle nature, the membrane layer 42 can shatter into many particles when the membrane assembly 80 breaks. The debris from the broken membrane assembly 80 can contaminate other parts of the lithographic apparatus 100. For example, debris from the broken membrane assembly 80 can contaminate optical components of the lithographic apparatus 100. Contamination from the debris of the broken membrane assembly 80 can reduce the quality of optical functions carried out by the optical components of the lithographic apparatus 100.

For example, in an embodiment the at least one membrane layer 42 is formed from polycrystalline or nanocrystalline silicon. Polycrystalline or nanocrystalline silicon has a brittle nature. Hence, a membrane assembly 80 comprising a membrane 70 that comprises a membrane layer 42 formed from polycrystalline or nanocrystalline silicon can shatter into many particles when the membrane assembly 80 breaks.

The lower capping film 47 and upper capping film 48 can at least partially contain debris generated when the membrane layer 42 breaks and reduce contamination of other parts of the lithographic apparatus 100.

In an embodiment the material for each of either or both of the lower capping film 47 and upper capping film 48 is a silicon nitride. For example, in an embodiment the material for each of either or both of the lower capping film 47 and upper capping film 48 is an amorphous silicon nitride. However, other silicon nitrides may be suitable. In an embodiment each of either or both of the lower capping film 47 and upper capping film 48 is thick enough to allow each of either or both of the lower capping film 47 and upper capping film 48 to perform its function of containing the membrane layer 42 when the membrane layer breaks 42 breaks. In an embodiment the thickness of each of either or both of the lower capping film 47 and upper capping film 48 is at least about 1 nm, and optionally at least about 2 nm. In an embodiment each of either or both of the lower capping film 47 and upper capping film 48 is thin enough so that the membrane 70 of the membrane assembly 80 including either or both of the lower capping film 47 and upper capping film 48 has sufficiently good optical properties, particularly for transmission of EUV radiation. In an embodiment the thickness of each of either or both of the lower capping film 47 and upper capping film 48 is at most about 10 nm, and optionally at most about 5 nm. In an embodiment the thickness of each of either or both of the lower capping film 47 and upper capping film 48 is about 2.5 nm.

The method of applying the lower capping film 47 or upper capping film 48 to the stack 60 is not particularly limited. In an embodiment the lower capping film 47 or upper capping film 48 is applied to the stack by chemical vapor deposition, for example LPCVD at a temperature in the range of about 750 to 900° C., for example at of about 850° C., or PECVD. However, in an alternative embodiment the lower capping film 47 or upper capping film 48 is applied to the stack 60 by a sputtering method or by a thin filming method, for example.

It is not necessary for each of either or both of the lower capping film 47 and upper capping film 48 to be provided. In an embodiment the stack 60 does not comprise any lower capping film 47, does not comprise any upper capping film 48, or does not comprise any lower capping film 47 and does not comprise any upper capping film 48. In an embodiment the membrane assembly 80 produced by the manufacturing method does not comprise any lower capping film 47, does not comprise any upper capping film 48, or does not comprise any lower capping film 47 and does not comprise any upper capping film 48.

In an embodiment, the stack 60 comprises an upper etch barrier 46 above the at least one membrane layer 42. Optionally the upper etch barrier 46 is above and in contact with the at least one membrane layer 42 or, where provided, the upper capping film 48. In an embodiment, the stack 60 comprises a lower etch barrier 44 below the at least one membrane layer 42. Optionally the lower etch barrier 44 is below and in contact with the at least one membrane layer 42 or, where provided, the lower capping film 47. Where both the upper etch barrier 46 and the lower etch barrier 44 are provided, at least a portion of the upper etch barrier 46 and a portion of the lower etch barrier 44 that together sandwich a portion of the at least one membrane layer 42 are removed during the processing to form the membrane assembly 80 to release the at least one membrane layer 42 and form the membrane. Where only one of the upper etch barrier 46 and the lower etch barrier 46 is provided, at least a portion of the provided upper etch barrier 46 or lower etch barrier 44 will be removed during the processing to form the membrane assembly 80 to release the at least one membrane layer 42 and form the membrane.

In an embodiment the upper etch bather 46 and lower etch bather 44 are each directly adjacent to the at least one membrane layer 42 and are each configured to apply substantially equal tensile or compressive forces to the at least one membrane layer 42.

In an embodiment, at least 50% by thickness (optionally at least 80%, optionally at least 90%, optionally at least 95%, optionally at least 98%, optionally at least 99%) of the upper etch barrier 46 has the same chemical composition respectively as at least 50% (optionally at least 80%, optionally at least 90%, optionally at least 95%, optionally at least 98%, optionally at least 99%) by thickness of the lower etch barrier 44. In an embodiment, a thickness of the upper etch barrier 46 differs from a thickness of the lower etch barrier 44 layer by less than 50% (optionally less than 20%, optionally less than 10%, optionally less than 5%, optionally less than 2%, optionally less than 1%). The at least one membrane layer 42 is thus supported symmetrically by the upper etch barrier 46 and lower etch barrier 44.

Supporting the at least one membrane layer 42 symmetrically ensures that the same or similar tensile or compressive forces are applied to each side of the at least one membrane layer 42. Distortion of the at least one membrane layer 42 due to unbalanced forces is reduced. Furthermore, where 80% or more of the lower etch barrier 44 and upper etch barrier 46 comprise tetraethylorthosilicate (TEOS), as described in the context of a specific example below, the forces applied will comprise much lower compressive forces, compared with alternative materials (such as thermal oxide), or may even comprise tensile forces. A lower compressive force or tensile force reduces wrinkles or fluffy textures in the at least one membrane layer 42, which might otherwise occur after removal of the planar substrate 40 and lower and upper etch barriers 44,46. Yield can therefore be increased.

In an embodiment, the upper etch barrier 46 comprises a plurality of layers of different composition. In an embodiment the thickest of the plurality of layers comprises tetraethylorthosilicate (TEOS) formed using LPCVD or PECVD. In an embodiment the lower etch barrier 44 comprises a plurality of layers of different composition. In an embodiment a thickest of the plurality of layers comprises tetraethylorthosilicate (TEOS) formed using LPCVD or PECVD.

In an embodiment the lower etch barrier 44 comprises in sequence a first lower etch barrier layer, a second lower etch barrier layer and a third lower etch barrier layer. The first lower etch barrier layer is closest to the planar substrate 40. In an embodiment the first lower etch barrier layer is thinner than the second and third lower etch barrier layers and is configured to act as an etch stop layer against a removal process (e.g. KOH or TMAH, tetramethylammonium hydroxide, etch) for removing regions of the planar substrate 40. In an embodiment the first lower etch barrier layer comprises silicon nitride. The layer of silicon nitride may be formed for example using LPCVD at a temperature in the range of 750 to 900° C., for example at 850° C., or PECVD. In an embodiment the layer of silicon nitride has a thickness of approximately 2-10 nm. In an embodiment the second lower etch barrier layer comprises a tetraethylorthosilicate (TEOS) layer. The TEOS layer may be formed for example using LPCVD at 725° C., or PECVD. In an embodiment the TEOS layer has a thickness of approximately 500 nm. In an embodiment the third lower etch barrier layer is a sacrificial layer. In an embodiment, the composition of the third lower etch barrier layer is chosen so that a selective etch can remove the third lower etch barrier layer without removing a lower capping film 47 of the at least one membrane layer 42. In an embodiment the third lower etch barrier layer comprises an amorphous silicon layer. In an embodiment the amorphous silicon layer is formed using LPCVD at a temperature in the range of about 500 to 620° C., for example at about 560° C., or PECVD. In an embodiment, the third lower etch barrier layer is approximately 30 nm thick.

In an embodiment the upper etch barrier 46 comprises a first upper etch barrier layer and a second upper etch barrier layer. The first upper etch barrier layer is closest to the at least one membrane layer 42. In an embodiment the first upper etch barrier layer is a sacrificial layer. In an embodiment, the composition of the first upper etch barrier layer is chosen so that a selective etch can remove the first upper etch barrier layer without removing an upper capping layer 48 of the at least one membrane layer 42. In an embodiment the first upper etch barrier layer comprises an amorphous silicon layer. In an embodiment the amorphous silicon layer is formed using LPCVD at a temperature in the range of about 500 to 620° C., for example at 560° C., or PECVD. In an embodiment, the first upper etch barrier layer is approximately 30 nm thick. In an embodiment the second upper etch barrier layer, which is positioned on top of the first upper etch barrier layer, comprises TEOS. The TEOS may be formed for example using LPCVD at 725° C., or PECVD. In an embodiment the second upper etch barrier layer has a thickness of approximately 500 nm. Optionally a third upper etch barrier layer may be provided that has the same composition as the first lower etch barrier layer of the lower etch barrier 44 to make the upper etch barrier 46 completely symmetric with the lower etch barrier 44.

As shown for example in FIG. 4, the planar substrate 40 comprises an inner region 61, a border region 62 around the inner region 61 (e.g. surrounding the inner region 61 when viewed in a direction perpendicular to the plane of the planar substrate 40), a bridge region 63 around the border region 62 (e.g. surrounding the border region 62 when viewed in a direction perpendicular to the plane of the planar substrate 40), and an edge region 64 around the bridge region 63 (e.g. surrounding the bridge region 63 when viewed in a direction perpendicular to the plane of the planar substrate 40). The bridge region 63 comprises a first portion 63A and a second portion 63B. In an embodiment the first portion 63A is below the second portion 64A.

The method comprises selectively removing the inner region 61 and the first portion 63A of the bridge region 63 to form a membrane assembly 80. In an embodiment, these regions are removed according to the methods described below with reference to FIGS. 4 to 26, providing the example membrane assemblies 80 shown in FIGS. 10-18, 22, 23, 25, 26, 41, 42, 44-46, 48-53, 57-60, 62, 63, 65-73. The membrane assembly 80 may be processed further to make the membrane assembly 80 suitable for practical use.

The membrane assembly 80 comprises a membrane 70. The membrane 70 is formed from the at least one membrane layer 42. The membrane 70 comprises the at least one membrane layer 42. The membrane 70 may comprise one or more further layers, such as a lower capping film 47 and an upper capping film 48.

Figure 10:
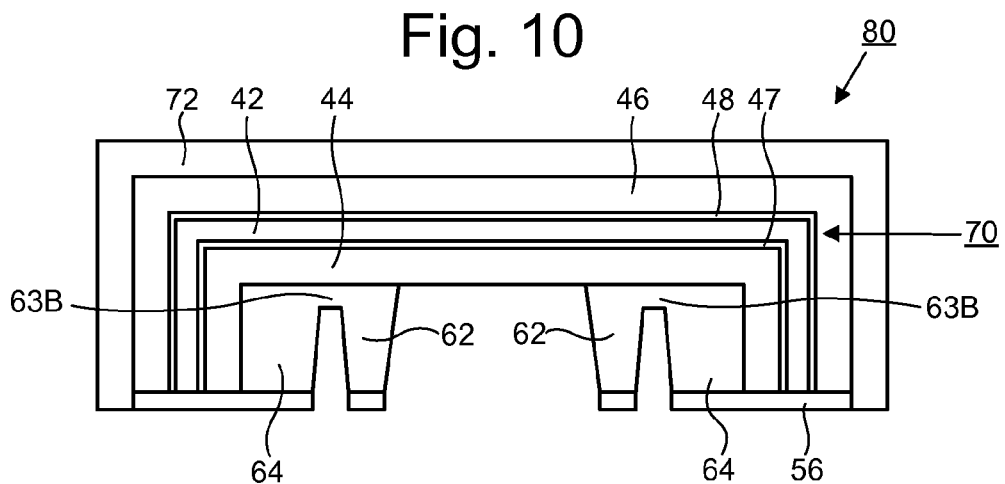

As shown for example in FIG. 10, after selective removal of the inner region 61 and first portion 63A of the bridge region 63, the membrane assembly 80 comprises a border holding the membrane 70. The border is formed from the border region 62 of the planar substrate 40. The membrane assembly 80 at this stage further comprises an edge section around the border. The edge section is formed from the edge region 64 of the planar substrate 40. The membrane assembly 80 at this stage further comprises a bridge between the border and the edge section. The bridge is formed from the at least one membrane layer 42 and the second portion 63B of the bridge region 63 of the planar substrate 40. In the embodiment of FIG. 10 the bridge further comprises additional layers above the second portion 63B of the bridge section 63, as will be described in further detail below. The removal of the first portion 63A of the bridge region 63 maintains but thins an integral connection between the border region 62 and the edge region 64. In other embodiments discussed below the bridge region 63 may be removed entirely, thereby removing the integral connection between the border region 62 and the edge region 64.

Example processing for manufacturing a membrane assembly to the stage shown in FIG. 10 will now be described in further detail.

Initially a planar substrate 40 is provided as shown in FIG. 3.

The planar substrate 40 is processed to form a stack 60 comprising a sequence of layers on the planar substrate 40 as shown in FIG. 4. The sequence of layers comprises in order from the planar substrate 40 outwards: a lower etch barrier 44, a lower capping film 47, at least one membrane layer 42, an upper capping film 48, and an upper etch barrier 46. Example compositions for the lower etch barrier 44, lower capping film 47, at least one membrane layer 42, upper capping film 48 and upper etch barrier 46 have been disclosed above.

Figure 5:
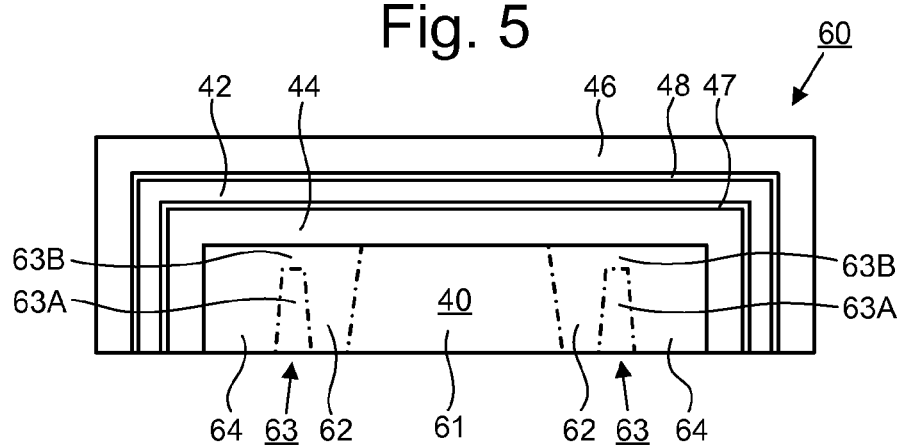

The stack 60 is processed further to form the stack 60 shown in FIG. 5. In an embodiment the processing comprises multiple consecutive wet and dry etching steps, including top side protection, to etch away the layers on the bottom of the stack 60 up to the planar substrate 40.

The stack 60 is processed further to apply a KOH or TMAH etch barrier 56 on the bottom of the stack 60. A photoresist layer 52 is subsequently formed around the whole stack 60 to form the arrangement shown in FIG. 6.

The photoresist layer 52 selectively exposed through a mask 54 (FIG. 7) to define the shapes of the inner region 61 and first portion 63A of the bridge region 63 to be removed in subsequent etching steps. The stack 60 is then processed using multiple consecutive steps, including developing, stripping, and dry and wet etching, to form the stack 60 as shown in FIG. 8.

Openings in the KOH or TMAH etch barrier layer 56 are formed to be narrow enough (e.g. less than 1 mm) that a rate of etching through the planar substrate 40 in a later step will be slower within the first portion 63A of the bridge region 63 than in the inner region 61. In this way it can be arranged that the inner region 61 can be removed completely at least up to the first of the layers formed on the planar substrate 40 while only the first portion 63A of the bridge region 63 is removed (and not the second portion 63B of the bridge region 63, above the first portion 63A of the bridge region 63).

Figure 9:
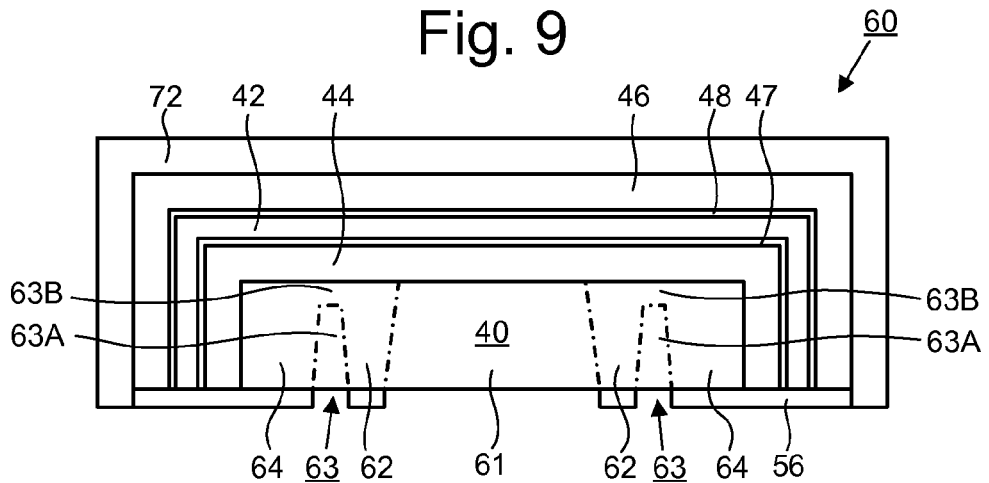

The stack 60 of FIG. 8 is provided with a protection layer 72 to form the stack shown in FIG. 9. In embodiments of this type the protection layer 72 is provided over at least a top surface of the stack 60. The at least one membrane layer 42 is thus between the protection layer 72 and the planar substrate 40. The protection layer is also provided over side surfaces of the stack 60. The protection layer 72 is resistant to a removal process used for selectively removing the inner region 61 and the first portion 63A of the bridge region 63 of the planar substrate 40.

The removal process for selectively removing the inner region 61 and the first portion 63A of the bridge region 63 of the planar substrate 40 is applied to form the membrane assembly 80 shown in FIG. 10. In an embodiment the removal process comprises a wet etching process. The wet etchant may be KOH or TMAH. For example, in an embodiment the stack 60 of FIG. 9 is placed into a bath of KOH or TMAH and subsequently removed from the bath of KOH or TMAH using a handling tool. Other wet etchants such as EDP (an aqueous solution of ethylene diamine and pyrocatechol) can be used. The presence of the protection layer 72, the lower etch barrier 44 and the upper etch barrier 46 mechanically supports the at least one membrane layer 42 so that the membrane is less likely to be damaged during the process of etching the planar substrate 40.

In an embodiment the protection layer 72 is thick enough to provide sufficient mechanical protection to the stack 60. In an embodiment the protection layer 72 has a thickness of at least about 1 µm, and optionally at least about 2 µm. In an embodiment the protection layer 72 is thin enough so as to sufficiently reduce the process time required for applying the protection layer 72. In an embodiment the protection layer 72 has a thickness of at most about 10 µm, and optionally at most about 5 µm. In an embodiment the protection layer 72 has a thickness of about 4 µm.

The protection layer 72 is sufficiently mechanically robust so as to provide mechanical protection to the border region 62 during the step of selectively removing the inner region 61 of the planar substrate 40. The protection layer 72 may be a conformal coating for protecting the coated surface, having good bather properties such as being resistant to solvents (e.g. insoluble at room temperature), moisture, corrosion, chemical attack. It is generally desired that the protection layer 72 provides a uniform layer thickness with no pinholes. In an embodiment the step of selectively removing the inner region 61 of the planar substrate 40 comprises using a chemical etchant (e.g. KOH or TMAH). In such embodiments the protection layer 72 is chemically resistant to the chemical etchant. For example, in an embodiment the protection layer 72 is chemically resistant to KOH or TMAH. This means that when the chemical etchant is used, the protection layer 72 is either not etched away at all, or is etched away at a much lower etching rate compared to the inner region 61 of the planar substrate 40.

In an embodiment, the protection layer 72 comprises an organic polymer, for example a poly(p-xylylene) polymer such as Parylene or ProTEK® type materials for example.

In an embodiment, the protection layer 72 comprises silicon nitride. The silicon nitride may be deposited using LPCVD or PECVD.

At stages in the method where the edge region 64 is still connected to the border region 62, the shape and size of the membrane assembly 80 will be approximately the same as the shape and size of the original planar substrate 40. In order to provide a membrane assembly 80 having a shape suitable for use in the lithographic apparatus 100 the edge section is separated from the border by cutting or breaking the bridge.

In an embodiment, the bridge is broken by applying a mechanical stress to the membrane assembly 80. In an alternative embodiment, the bridge is broken by cutting through the bridge using a laser. Debris removal tools, sometimes referred to as flake removal tools, may be used to remove any debris or flakes that are generating during the breaking of the bridge. The debris removal tools may apply suction during the breaking of the bridge for example.

Figure 11:
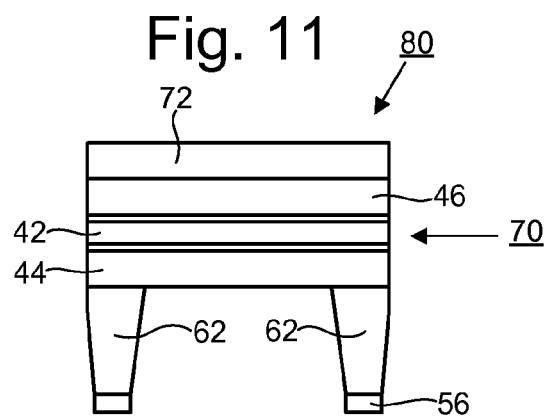
FIGS. 11 to 14 schematically depict stages subsequent to the stages shown in FIGS. 3 to 10 according to an embodiment.

FIG. 11 depicts the result of breaking the bridge of the membrane assembly 80 shown in FIG. 10 to produce the membrane assembly 80 shown in FIG. 11. In this embodiment, the bridge comprised the second portion 63B of the bridge region 63 of the planar substrate 40 and the layers formed on the second portion 63B of the bridge region 63 (the lower etch barrier 44, the lower capping film 47, the at least one membrane layer 42, the upper capping film 48, the upper etch barrier 46 and the protection layer 72).

Figure 12:
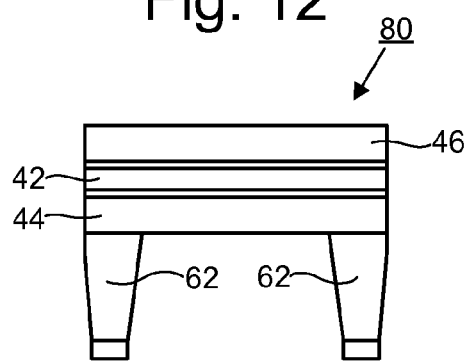

In this embodiment, the protection layer 72 is removed after separation of the edge section from the border, to form the membrane assembly 80 shown in FIG. 12. The protection layer 72 may be removed using an intense oxygen plasma treatment, for example an $O_2$ barrel etch or a RIE etch, or by using another removal technique. At least the upper etch barrier 46, which may be provided directly beneath the protection layer 72, is resistant to the removal process used to remove the protection layer 72. Optionally the lower etch barrier 44 is also resistant to the removal process used to remove the protection layer 72. For example, each of either or both of the lower etch barrier 44 and upper etch barrier 46 is resistant to an $O_2$ barrel etch, a RIE etch or another removal technique suitable for removing the protection layer 72. The lower etch barrier 44 and upper etch barrier 46 thus protect the at least one membrane layer 42 and any capping films 47, 48 during all of the removal process for removing the protection layer 72. Damage to, for example oxidation of, the at least membrane layer 42 and any capping films 47,48, due to the removal process for removing the protection layer 72, is therefore reduced or prevented.

Figure 13:
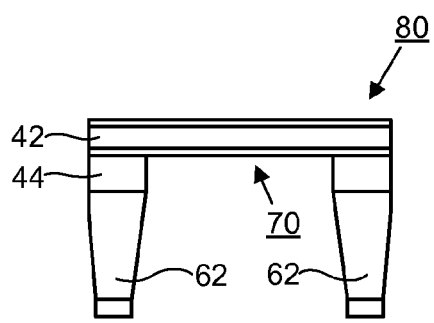

Wet etching can be used to remove the lower etch barrier 44 and upper etch barrier 46 to form the membrane assembly 80 shown in FIG. 13. Any flakes or debris remaining behind after removal of the protection layer 72 will be removed at the same time as the lower etch barrier 44 and upper etch barrier 46, and will not remain on the membrane 70. The mechanical strength provided by the lower etch barrier 44 and the upper etch barrier 46 may even allow mechanical polishing steps to be applied to the membrane assembly 80. Mechanical polishing steps may be more effective for removing relatively large debris or flakes, in comparison with etching alone. For example, a mechanical polishing process may be used to remove a first portion of the upper etch barrier 46, with a remaining portion of the upper etch barrier 46 being removed by wet etching.

It may be desirable to provide a further capping film 74 around the remaining exposed portions of the planar substrate 40 (in the embodiment of FIG. 13, the border region 62). Such a further capping film 74 may reduce or prevent contamination of the lithographic apparatus 100, for example due to outgassing from the planar substrate 40. In an embodiment, a further capping film 74 is applied to the whole outer surface of the membrane assembly 80 shown in FIG. 13, to provide the membrane assembly 80 shown in FIG. 14.

Figure 15:
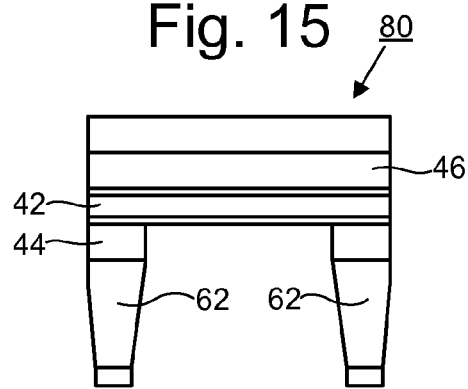
FIGS. 15 to 17 schematically depict stages subsequent to the stages shown in FIGS. 3 to 10 according to an alternative embodiment.

In an alternative embodiment, the further capping film 74 is formed so as not to cover an upper surface of the membrane assembly 80. This may be achieved for example by forming the protection layer 72 and lower etch barrier 44 in the arrangement of FIGS. 9-11 such that a portion of the lower etch barrier 44 underneath the at least one membrane layer 42 can be removed without removing the protection layer 72. An example membrane assembly 80 formed by selectively removing the portion of the lower etch barrier 44 while not removing the protection layer 72 is shown in FIG. 15.

Figure 16:
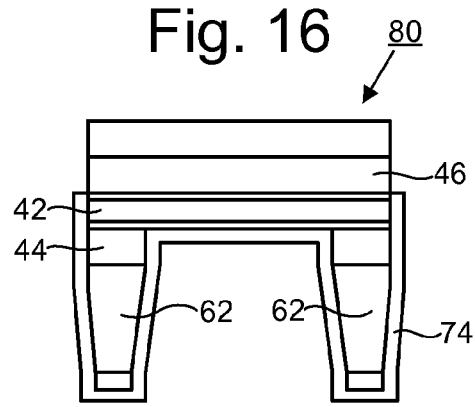
Figure 14:
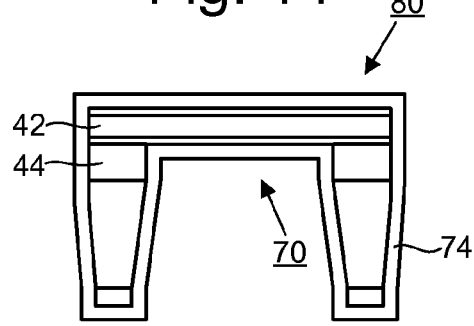

In a subsequent step the further capping film 74 is provided to cover the side surfaces up to and including the at least one membrane layer 42 and upper capping film 48. The further capping film 74 also covers all surfaces on the bottom side of the membrane assembly 80. The arrangement shown in FIG. 16 is thereby produced.

Figure 17:
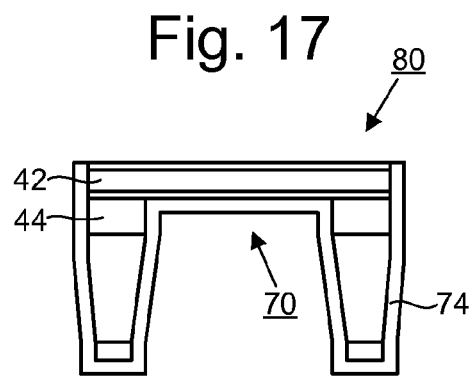

The protection layer 72 and upper etch bather 46 are removed subsequently to form the membrane assembly 80 shown in FIG. 17.

In a further alternative embodiment for forming the further capping film 74 around the surfaces of planar substrate 40, either or both of the lower capping film 47 and the upper capping film 48 may be omitted. The process flow described above with reference to FIGS. 3 to 13 may be used except that the method of forming the stack 60 shown in FIG. 4 is modified to omit either or both of the lower capping film 47 and the upper capping film 48. A membrane assembly 80 is formed which is the same as the membrane assembly 80 shown in FIG. 13 except that either or both of the lower capping film 47 and the upper capping film 48 are absent. The further capping film 74 (which in this case may be the only capping film) is then applied around all of the membrane assembly 80 to form the membrane assembly 80 depicted in FIG. 18.

In the embodiments described above the further capping film 74 is shown as covering all surfaces of the membrane assembly 80 below the upper capping film 48. This is not essential. In other embodiments the further capping film covers all surfaces of the planar substrate but not the bottom surface of the membrane 70. In this way contamination or outgassing from the planar substrate 40 can be reduced or avoided without decreasing a transmittance through the membrane 70.

The embodiments described above with reference to FIGS. 3-18 the separation of the edge section from the border is performed before removing the protection layer 72. An advantage of performing the separation prior to removing the protection layer 72 is that any debris or flakes produced by the separation process will be deposited on the protection layer 72 rather than on the at least one membrane layer 42. The debris or flakes may therefore be more easily removed. This is not essential however.

Figure 40:
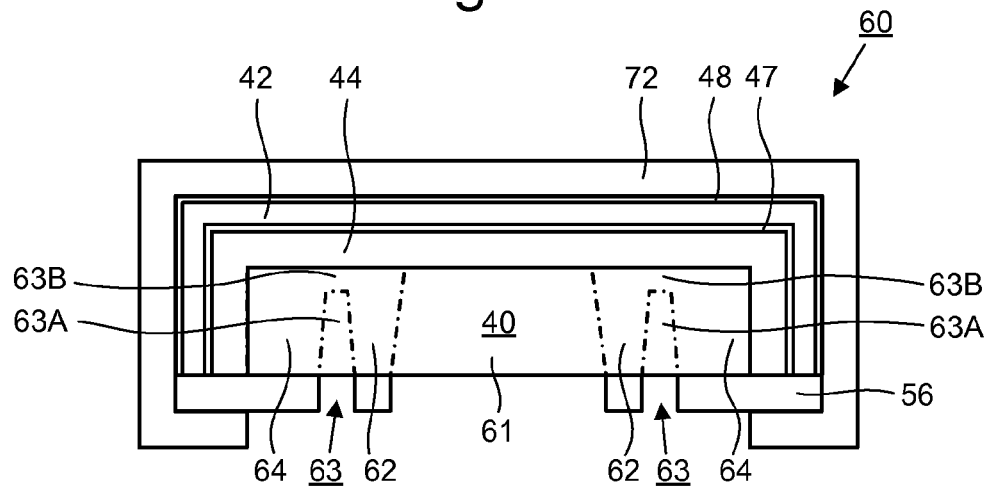
Figure 41:
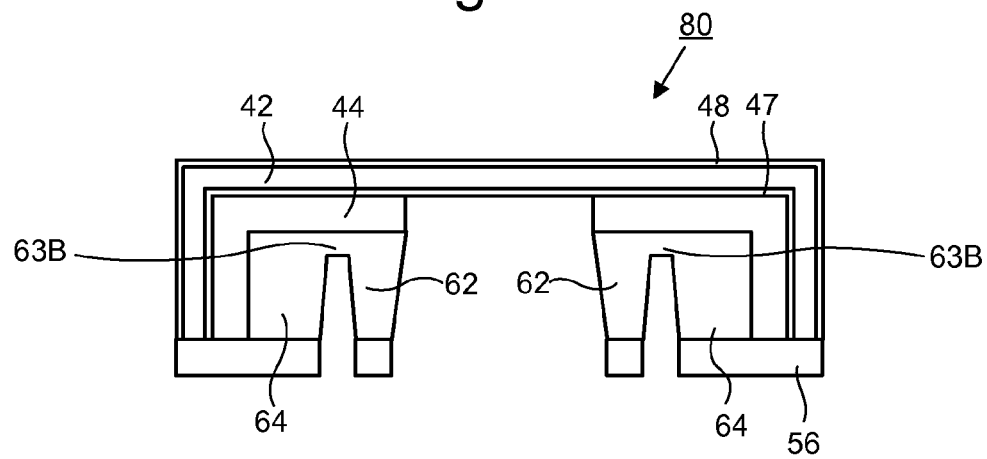
FIGS. 41 to 42 schematically depict example processing for manufacturing a membrane assembly 80 in which a protection layer 72 is removed prior to separation.
Figure 42:
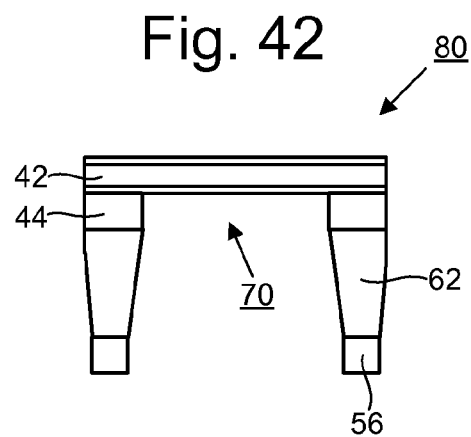

FIGS. 40-42 depict example processing for manufacturing a membrane assembly 80 in which a protection layer 72 is removed prior to separation.

Starting from the arrangement shown in FIG. 5, processing to form the arrangement shown in FIG. 40 is performed. An etch barrier 56 is applied on the bottom of the stack 60 (e.g. a KOH or TMAH etch barrier). The etch bather 56 is subsequently patterned and processed to perform openings, for example in a manner analogous to the process described above with reference to FIGS. 7 and 8, except that the processing in this embodiment also removes the upper etch bather 46. A protection layer 72 is then provided to form the stack 60 shown in FIG. 40. The protection layer 72 is provided over the top surface, over the side surfaces, and over a peripheral portion of the bottom surface of the stack 60, as shown in FIG. 40. The openings formed by the patterning in the etch bather 56 are not covered by the protection layer 72. The protection layer 72 is resistant to a removal process used for selectively removing the inner region 61 and the first portion 63A of the bridge region 63 of the planar substrate 40 and may have any of the compositions for the protection layer 72 described above (e.g. Parylene).

The removal process for selectively removing the inner region 61 and the first portion 63A of the bridge region 63 of the planar substrate 40 is then applied. The lower etch barrier 44 on the bottom side of the membrane layer 42 is also removed (e.g. using wet etching). Subsequently, the protection layer 72 is removed. The protection layer 72 may be removed using any of the methods for removing the protection layer 72 described above (e.g. intense oxygen plasma treatment). The membrane assembly 80 shown in FIG. 41 is thereby produced.

Subsequently, the bridge of the membrane assembly 80 shown in FIG. 41 is broken to produce the membrane assembly 80 shown in FIG. 42.

In a variation on the processing described above with reference to FIGS. 40-42, the removal of the protection layer 72 may be performed after the bridge of the membrane assembly 80 is broken. The protection layer 72 may provide useful mechanical support to the membrane layer 42 during the breaking of the bridge.

Figure 51:
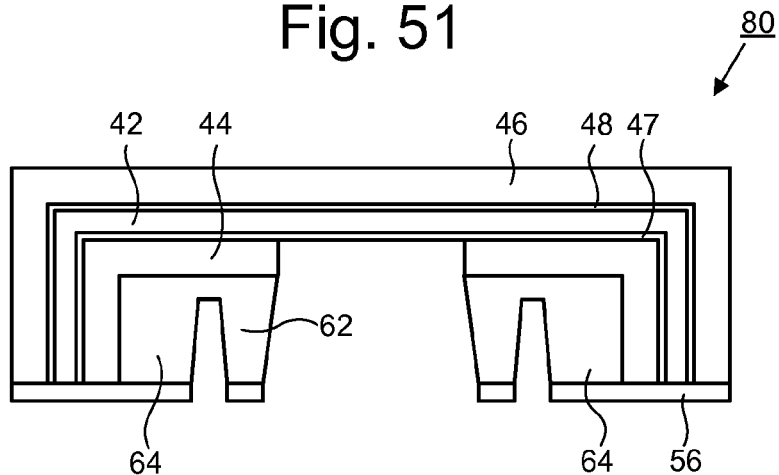
FIGS. 51 to 53 schematically depict alternative example processing for manufacturing a membrane assembly in which a protection layer is removed prior to separation.
Figure 52:
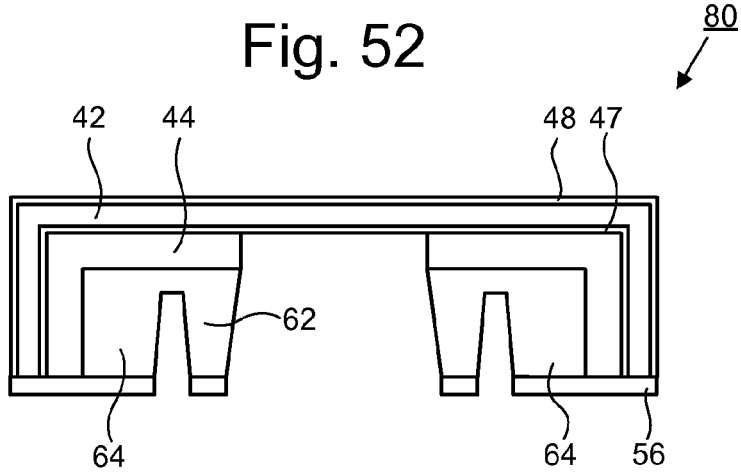
Figure 53:
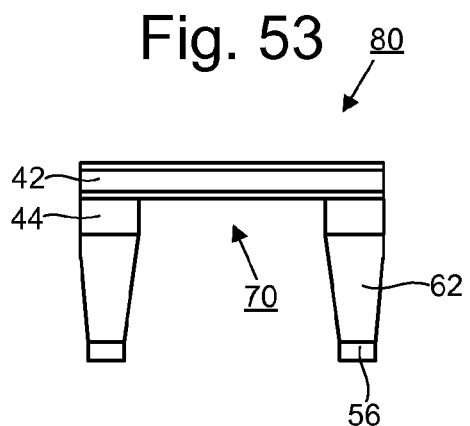

FIGS. 51-53 depict alternative example processing for manufacturing a membrane assembly 80 in which a protection layer 72 is removed prior to separation.

Starting from the arrangement of FIG. 9, processing to perform the arrangement shown in FIG. 51 is performed. The removal process for selectively removing the inner region 61 and the first portion 63A of the bridge region 63 of the planar substrate 40 is performed. The lower etch barrier 44 on the bottom side of the membrane layer 42 is also removed (e.g. using wet etching). Subsequently, the protection layer 72 is removed. The protection layer 72 may be removed using any of the methods for removing the protection layer 72 described above (e.g. intense oxygen plasma treatment). The membrane assembly 80 shown in FIG. 51 is thereby produced. The upper etch barrier 46 protects the at least one membrane layer 42 during removal of the protection layer 72.

Subsequently, the upper etch barrier 46 is removed (e.g. using wet etching) to produce the membrane assembly 80 shown in FIG. 52.

Subsequently, the bridge of the membrane assembly 80 shown in FIG. 52 is broken to produce the membrane assembly 80 shown in FIG. 53.

FIGS. 54-60 depict alternative example processing for manufacturing a membrane assembly 80 in which a protection layer 72 is removed prior to separation.

Figure 54:
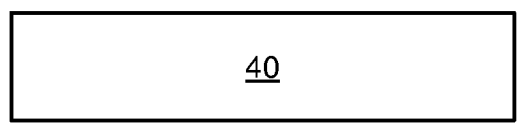
Figure 55:
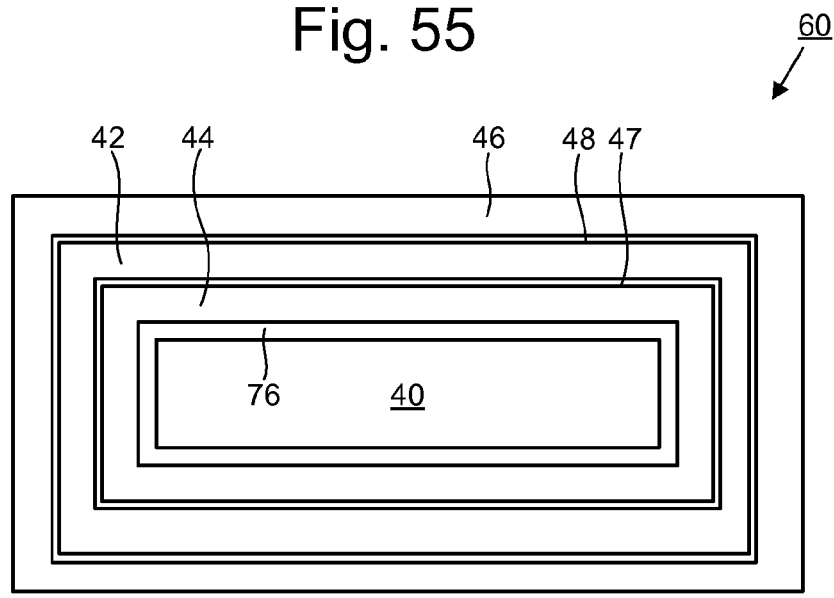

Starting from a planar substrate 40 as shown in FIG. 54, a stack 60 is produced comprising a sequence of layers on the planar substrate 40 as shown in FIG. 55. The sequence of layers comprises in order from the planar substrate 40 outwards: a lower sacrificial layer 76, a lower etch barrier 44, a lower capping film 47, at least one membrane layer 42, an upper capping film 48, and an upper etch barrier 46. Example compositions for the lower etch barrier 44, lower capping film 47, at least one membrane layer 42, upper capping film 48 and upper etch barrier 46 have been disclosed above.

In an embodiment the lower sacrificial layer 76 comprises silicon nitride. The method of depositing the lower sacrificial layer 76 is not particularly limited. In an embodiment the lower sacrificial layer 76 is applied to the planar substrate 40 by chemical vapor deposition. For example, in an embodiment the lower sacrificial layer 76 is applied by LPCDV or PECVD. Alternatively the lower sacrificial layer may be applied using a sputtering method or by a thin filming method. The thickness of the lower sacrificial layer 76 is not particularly limited. In an embodiment the thickness of the lower sacrificial layer 76 is in the range of 10 nm to 150 nm, optionally in the region of 100 nm.

Figure 56:
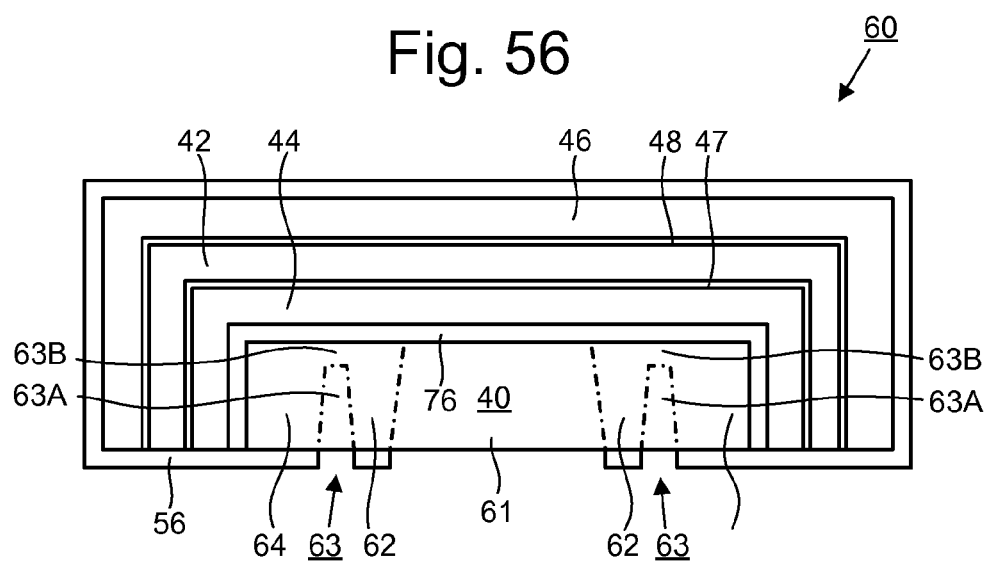
Figure 57:
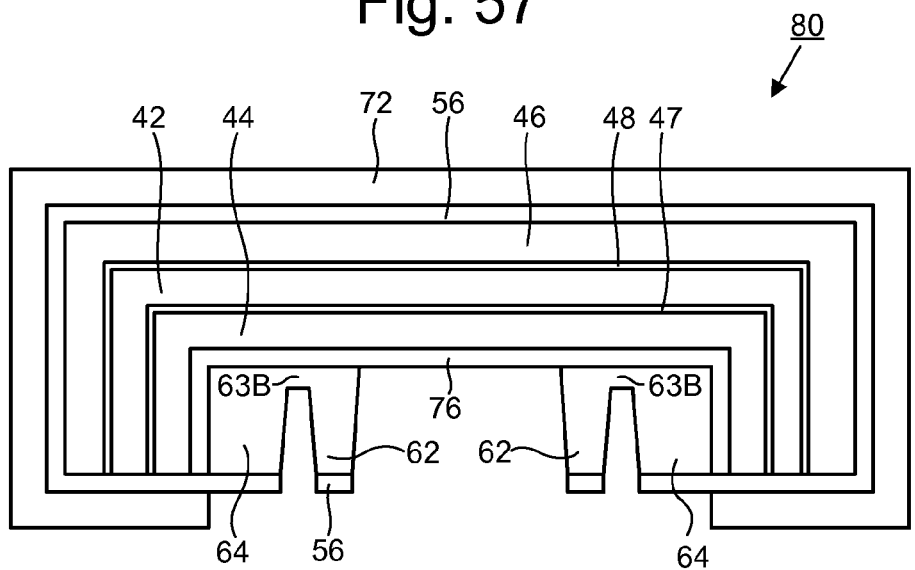

The stack 60 is processed further to form the stack 60 shown in FIG. 56. In an embodiment the processing comprises multiple consecutive wet and dry etching steps, including top side protection, to etch away the layers on the bottom of the stack 60 up to the planar substrate 40. Subsequently, an etch barrier 56 (e.g. KOH or TMAH etch barrier) is applied around the stack 60. The etch barrier 56 on the bottom of the stack 56 is subsequently patterned and processed to perform openings, for example in a manner analogous to the process described above with reference to FIGS. 7 and 8, to produce the stack 60 shown in FIG. 56.

A protection layer 72 is then provided over the top surface, over the side surfaces, and over a peripheral portion of the bottom surface of the stack 60. The openings formed by the patterning in the etch barrier 56 are not covered by the protection layer 72. The protection layer 72 is resistant to a removal process used for selectively removing the inner region 61 and the first portion 63A of the bridge region 63 of the planar substrate 40 and may have any of the compositions for the protection layer 72 described above (e.g. Parylene). Subsequently, the removal process for selectively removing the inner region 61 and the first portion 63A of the bridge region 63 of the planar substrate 40 is performed to produce the membrane assembly shown in FIG. 57.

Figure 58:
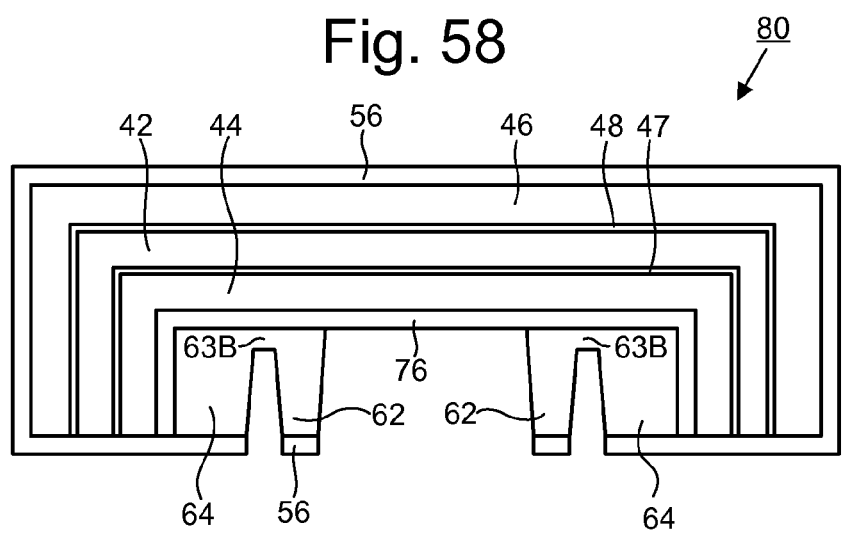

Subsequently, the protection layer 72 is removed. The protection layer 72 may be removed using any of the methods for removing the protection layer 72 described above (e.g. intense oxygen plasma treatment). The membrane assembly 80 shown in FIG. 58 is thereby produced. The at least one membrane layer 42 in this embodiment is supported symmetrically. The etch barrier 56 and upper etch barrier 46 are present on one side of the at least one membrane layer 42. The lower sacrificial layer 76 and lower etch barrier 44 are present on the other side of the at least one membrane layer 42. The etch barrier 56 may have the same composition and/or thickness as the lower sacrificial layer 76. Additionally or alternatively, the upper etch barrier 46 may have the same composition and/or thickness as the lower etch barrier 44. As described above, supporting the at least one membrane layer 42 symmetrically desirably ensures that the same or similar tensile or compressive forces are applied to each side of the at least one membrane layer 42.

Subsequently, the lower sacrificial layer 76, lower etch barrier 44, upper etch barrier 46, and etch barrier 56, are removed (e.g. by wet etching) to form the membrane assembly 80 shown in FIG. 59.

Figure 59:
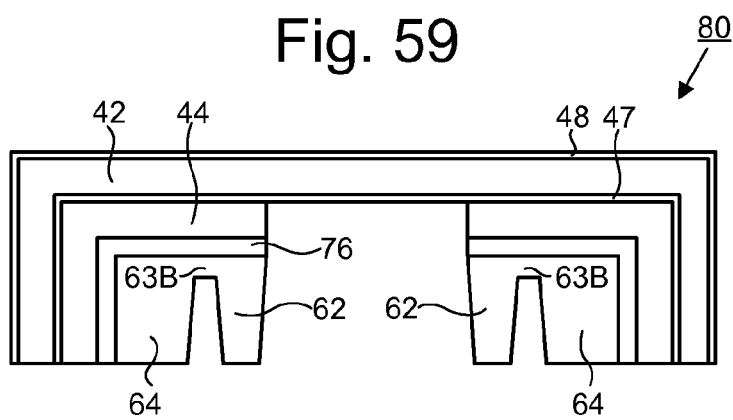
Figure 68:
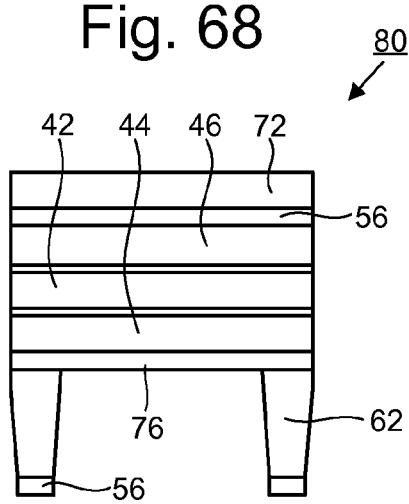
FIGS. 68-70 schematically depict example processing for manufacturing a membrane assembly in which a protection layer is removed after a bridge of a membrane assembly is broken.
Figure 69:
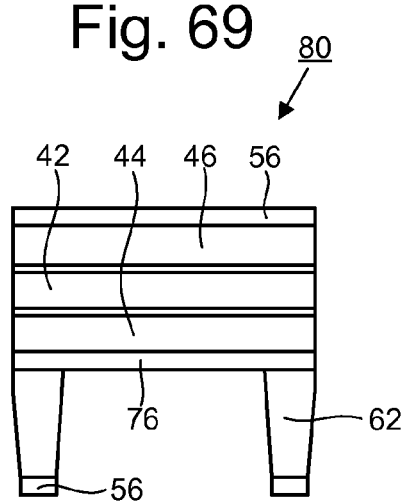
Figure 70:
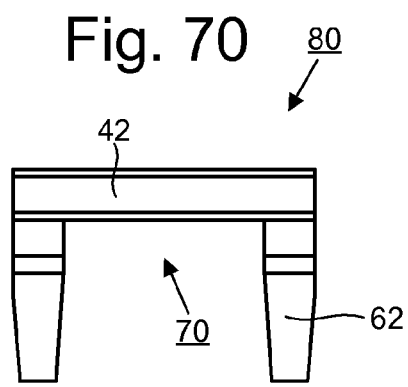

Subsequently, the bridge of the membrane assembly 80 shown in FIG. 59 is broken to produce the membrane assembly 80 shown in FIG. 60.

In a variation on the processing described above with reference to FIGS. 54-60, the removal of the protection layer 72 may be performed after the bridge of the membrane assembly 80 is broken. The protection layer 72 may provide useful mechanical support to the membrane layer 42 during the breaking of the bridge. In an embodiment of this type, breaking of the bridge starting from the arrangement of FIG. 57 would provide the membrane assembly of FIG. 68. Removal of the protection layer 72 (e.g. using intense oxygen plasma treatment) provides the membrane assembly of FIG. 69. Subsequently, the lower sacrificial layer 76, lower etch barrier 44, upper etch barrier 46, and the etch barrier 56 are removed (e.g. by wet etching) to form the membrane assembly 80 shown in FIG. 70.

Figure 71:
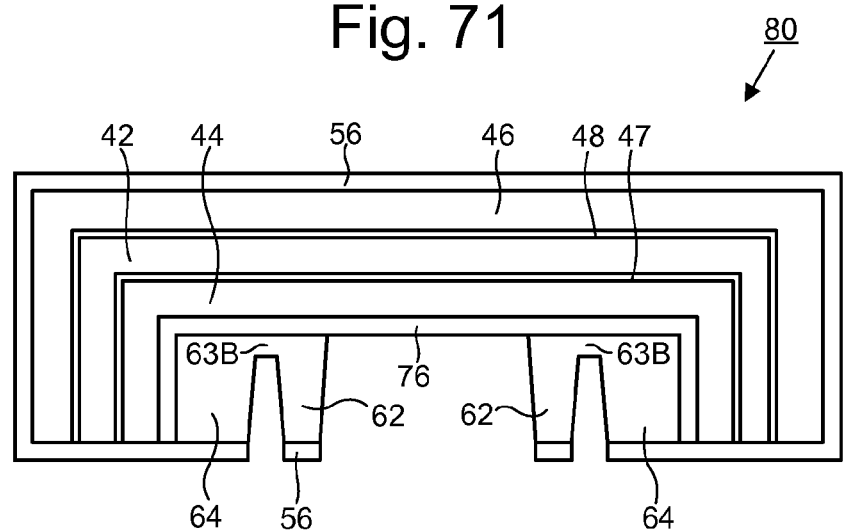
FIGS. 71-73 schematically depict example processing for manufacturing a membrane assembly in which a protection layer is not used.
Figure 72:
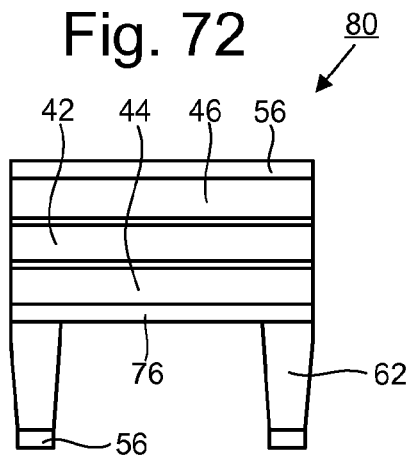
Figure 73:
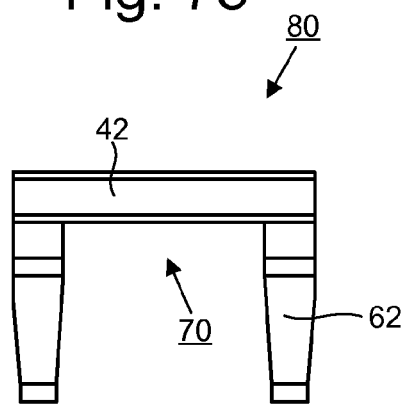

In a further variation on the processing described above with reference to FIGS. 54-60, the protection layer 72 is not used. In an embodiment of this type, the stack 60 shown in FIG. 56 is processed directly to selectively remove the inner region 61 and the first portion 63A of the bridge region 63 of the planar substrate 40, thereby producing the membrane 80 shown in FIG. 71. Subsequently, the bridge of the membrane assembly 80 shown in FIG. 71 is broken to produce the membrane assembly 80 shown in FIG. 72. Subsequently, the lower sacrificial layer 76, lower etch barrier 44, upper etch barrier 46, and the etch barrier 56 are removed (e.g. by wet etching) to form the membrane assembly 80 shown in FIG. 73.

In the embodiments described above with reference to FIGS. 3-18 the bridge region 63 is only incompletely removed by etching. This is not essential. The embodiments may be adapted so that the removal process for selectively removing portions of the planar substrate 40 selectively removes the inner region 61 and all of the bridge region 63, thereby removing an integral connection between the border region 62 and the edge region 64 of the planar substrate 40. This approach does not benefit from advantages associated with incomplete removal of the bridge region 63 (discussed below). However, advantages associated with separating the edge section from the border prior to removal of the protection layer 72 are retained (where this is performed).

Example processing for manufacturing a membrane assembly 80 in which all of the bridge region 63 is removed is described with reference to FIGS. 43-46.

Starting from the arrangement shown in FIG. 5, processing to form the arrangement shown in FIG. 43 is performed. An etch barrier 56 is applied on the bottom of the stack 60 (e.g. a KOH or TMAH etch barrier). The etch barrier 56 is subsequently patterned and processed to perform openings, for example in a manner analogous to the process described above with reference to FIGS. 7 and 8, except that in this embodiment the processing also removes the upper etch barrier 46. A protection layer 72 is then provided to form the stack 60 shown in FIG. 43. The protection layer 72 is provided over the top surface, over the side surfaces, and over a peripheral portion of the bottom surface of the stack 60, as shown in FIG. 43. The openings formed by the patterning in the etch barrier 56 are not covered by the protection layer 72. The protection layer 72 is resistant to a removal process used for selectively removing the inner region 61 and all of the bridge region 63 of the planar substrate 40 and may have any of the compositions for the protection layer 72 described above (e.g. Parylene).

The removal process for selectively removing the inner region 61 and all of the bridge region 63 of the planar substrate 40 is then applied. The lower etch barrier 44 on the bottom side of the membrane layer 42 is also removed (e.g. using wet etching) to form the membrane assembly 80 shown in FIG. 44.

Subsequently, the edge region 64 is separated from the border region 62 to produce the membrane assembly 80 shown in FIG. 45. The protection layer 72 provides mechanical support during this process.

Subsequently, the protection layer 72 is removed. The protection layer 72 may be removed using any of the methods for removing the protection layer 72 described above (e.g. intense oxygen plasma treatment). The membrane assembly 80 shown in FIG. 46 is thereby produced.

Alternative example processing for manufacturing a membrane assembly 80 in which all of the bridge region 63 is removed is described with reference to FIGS. 47-50.

Figure 47:
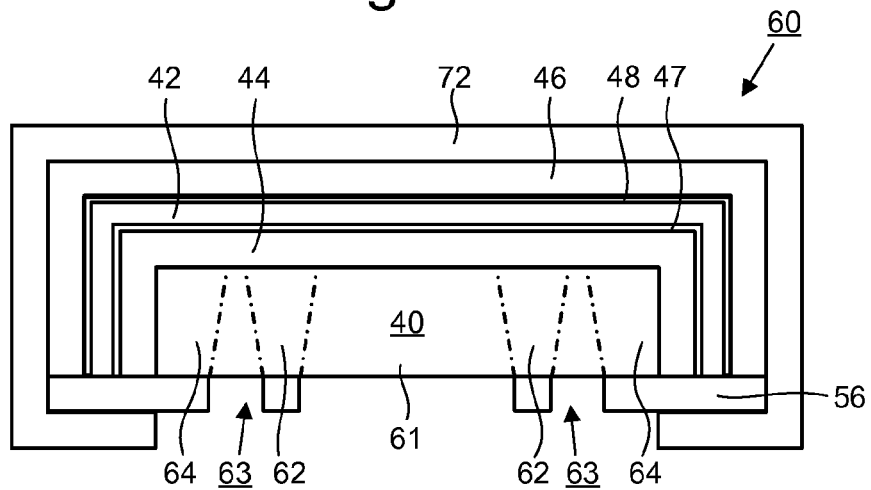
FIG. 47-50 schematically depict alternative example processing for manufacturing a membrane assembly in which all of a bridge region is removed.

Starting from the arrangement shown in FIG. 5, processing to form the arrangement shown in FIG. 47 is performed. An etch bather 56 is applied on the bottom of the stack 60 (e.g. a KOH or TMAH etch barrier). The etch bather 56 is subsequently patterned and processed to perform openings, for example in a manner analogous to the process described above with reference to FIGS. 7 and 8. A protection layer 72 is then provided to form the stack 60 shown in FIG. 47. The protection layer 72 is provided over the top surface, over the side surfaces, and over a peripheral portion of the bottom surface of the stack 60, as shown in FIG. 47. The openings formed by the patterning in the etch barrier 56 are not covered by the protection layer 72. The protection layer 72 is resistant to a removal process used for selectively removing the inner region 61 and all of the bridge region 63 of the planar substrate 40 and may have any of the compositions for the protection layer 72 described above (e.g. Parylene).

The removal process for selectively removing the inner region 61 and all of the bridge region 63 of the planar substrate 40 is then performed. The lower etch barrier 44 on the bottom side of the membrane layer 42 is also removed (e.g. using wet etching).

Figure 48:
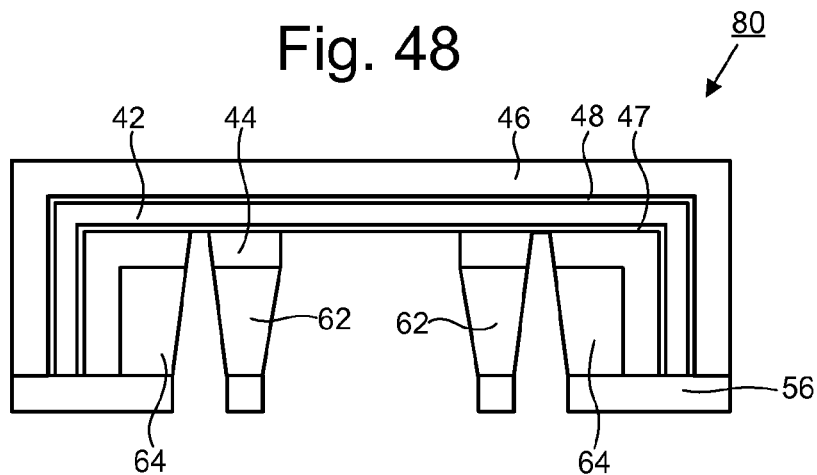

Subsequently, the protection layer 72 is removed to provide the membrane assembly 80 shown in FIG. 48. The protection layer 72 may be removed using any of the methods for removing the protection layer 72 described above (e.g. intense oxygen plasma treatment).

Figure 49:
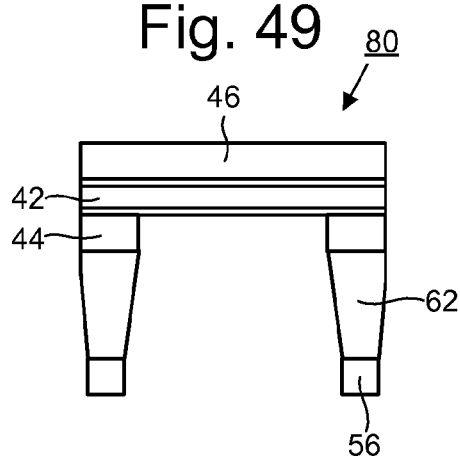

Subsequently, the edge region 64 is separated from the border region 62 to produce the membrane assembly 80 shown in FIG. 49. The separation of the edge region 64 may also be referred to as removal of the edge region.

Figure 50:
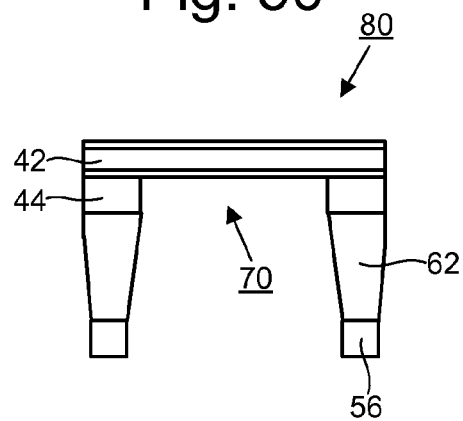

Subsequently, the upper etch barrier 46 is removed (e.g. by wet etching) to produce the membrane assembly 80 shown in FIG. 50. FIGS. 19-26 depict stages in a method according to an alternative embodiment. The embodiment is similar to the embodiments described above with reference to FIGS. 3-18 in that the separation of the edge region 64 of the planar substrate 40 is achieved by selectively removing a first portion 63A of a bridge region 63 while not removing a second portion 63B above the first portion 63A. The bridge formed from the second portion 63B is subsequently broken by applying a mechanical stress or by using a laser.

The method may begin using a planar substrate 40 as described above with reference to FIG. 3. The planar substrate 40 may be processed subsequently to form a stack 60 comprising a sequence of layers on the planar substrate 40 as shown in FIG. 19. The sequence of layers comprises in order from the planar substrate 40 outwards: a lower sacrificial layer 76, a lower etch barrier 44, at least one membrane layer 42, and an upper etch barrier 46. The lower etch barrier 44, at least one membrane layer 42 and upper etch barrier 46 may be formed for example as described above with reference to FIGS. 3-18. The stack 60 may optionally further comprise either or both of a lower capping film 47 and an upper capping film 48 around the at least one membrane layer 42, optionally formed as described above with reference to FIGS. 3-18.

Example characteristics of the lower sacrificial layer 76 have been described above.

The stack 60 is processed further to form the stack 60 shown in FIG. 20. The processing may comprise multiple consecutive wet and dry etching steps, including top side protection, to etch away the layers on the bottom of the stack 60.

The stack 60 is processed further to form a protection layer 72 around the stack 60. The protection layer 72 may be formed for example as described above with reference to FIG. 9. A patterned KOH or TMAH etch barrier 56 is then formed on the bottom of the stack 60 to form the stack 60 depicted in FIG. 21. The processing may for example comprise use of a mask and photoresist layer, followed by developing, stripping, and dry and wet etching, as described above with reference to FIGS. 7 and 8.

Figure 21:
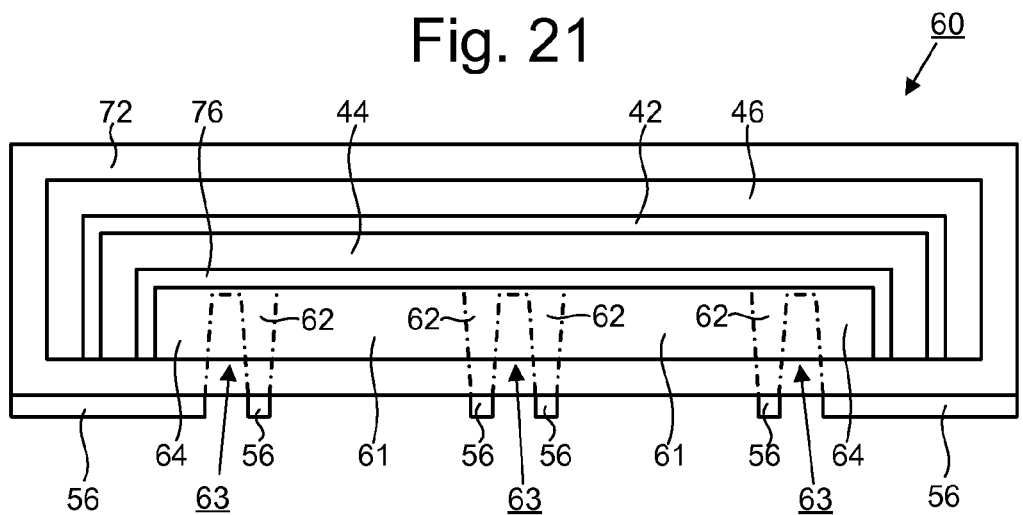

FIG. 21 depicts inner regions 61, border regions 62, bridge regions 63, and an edge region 64 of the planar substrate 40.

Figure 22:
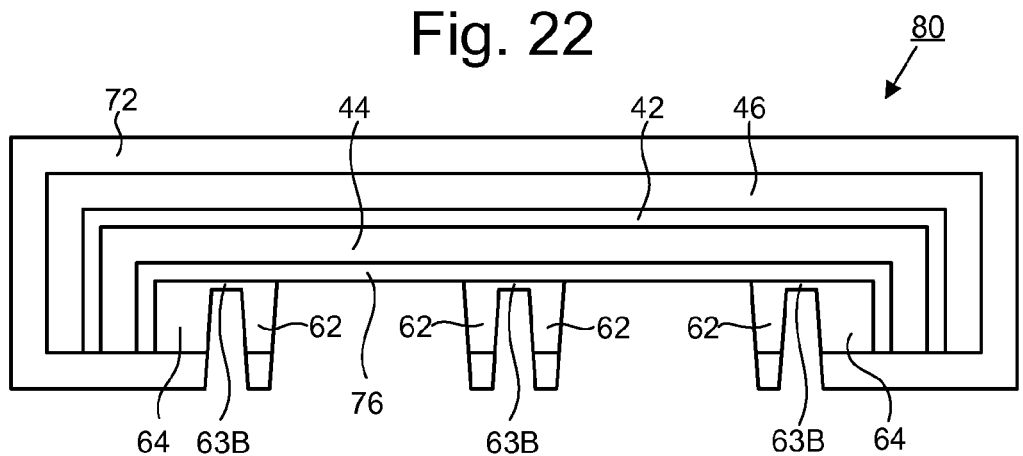

The removal process for selectively removing the inner regions 61 and the first portions 63A of the bridge regions 63 of the planar substrate 40 is applied to form the membrane assembly 80 shown in FIG. 22. The removal process may be carried out for example as described above with reference to FIG. 10.

Figure 23:
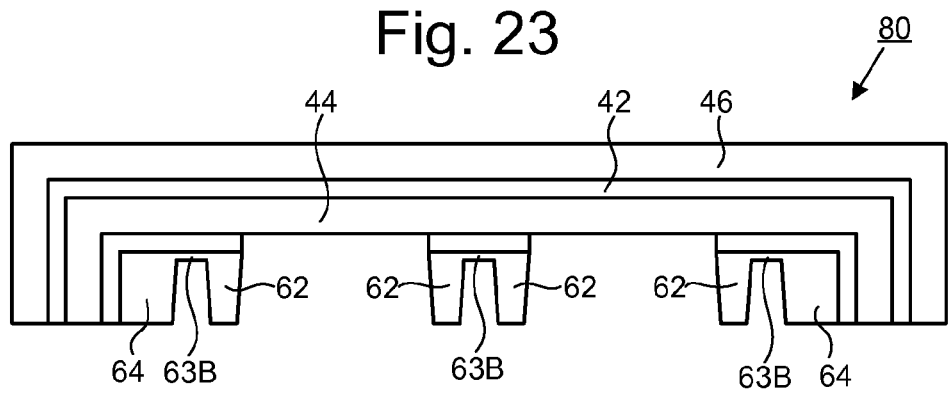
Figure 24:
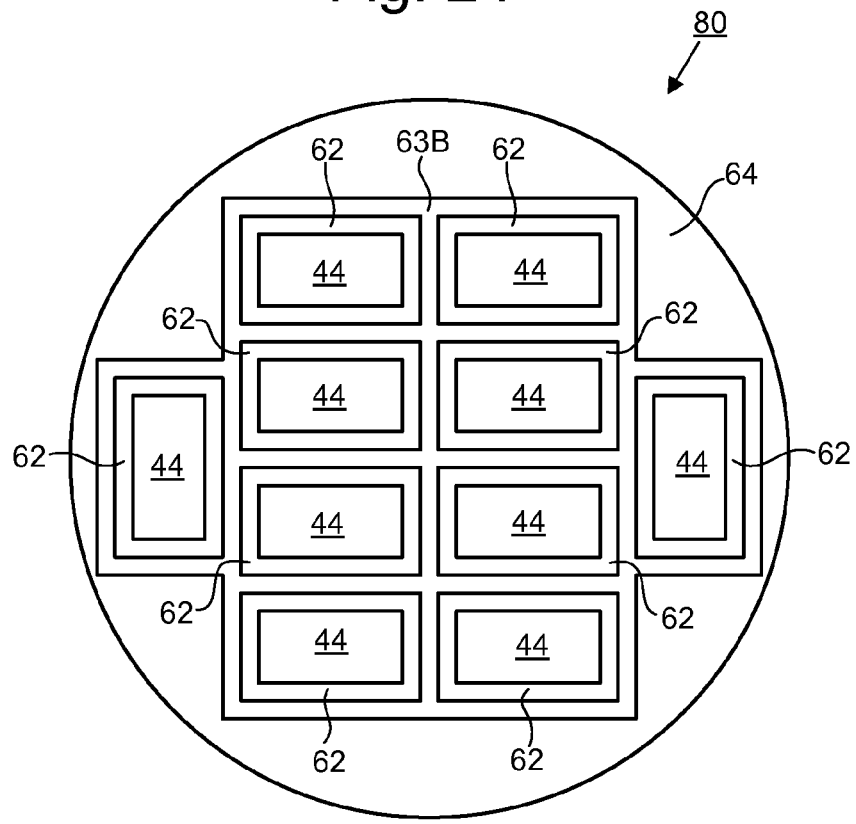
FIG. 24 is a schematic bottom view of the arrangement shown in FIG. 23.

The protection layer 72 is removed to form the membrane assembly 80 shown in FIG. 23. The protection layer 72 may be removed for example as described above with reference to FIG. 12. FIG. 24 is a bottom view of the membrane assembly 80 of FIG. 23.

In this embodiment the planar substrate 40 is configured to provide plural membrane assemblies 80. An example layout for the plural membrane assemblies 80 can be seen in FIG. 24. In this schematic example, ten regions are shown where the lower etch barrier 44 is visible due to removal of ten corresponding inner regions 61. Each of the ten regions is surrounded by a border formed from a border region 62. Each border is surrounded (in the view of FIG. 24) by a closed loop formed by the remaining second portion 63B of the bridge region 63 of the planar substrate 40. All of the second portions 63A are in turn surrounded by the edge section formed by the edge region 64 of the planar substrate 40.

It is not essential for plural membrane assemblies 80 to be formed from the planar substrate 40 according to this embodiment. The method may be adapted to form only a single membrane assembly 80. It is also not essential for the methods described above with reference to FIGS. 3 to 18 to form only a single membrane assembly 80 from the planar substrate 40. Those methods may be adapted to form plural membrane assemblies 80.

Figure 25:
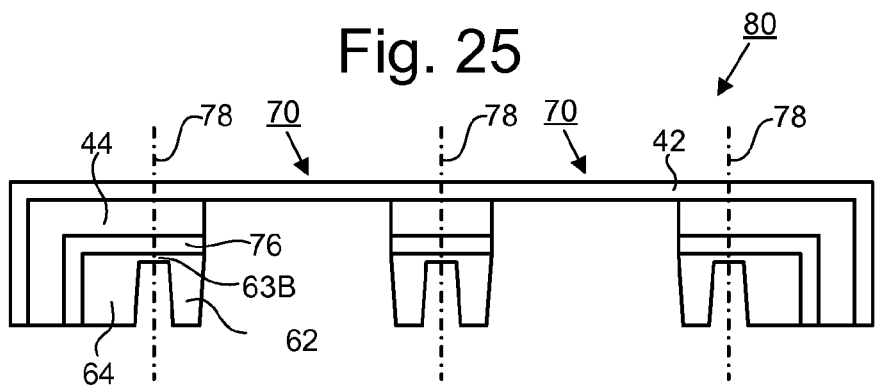
FIGS. 25 and 26 depict separation of the membrane assemblies following the stages depicted in FIGS. 19 to 24.
Figure 26:
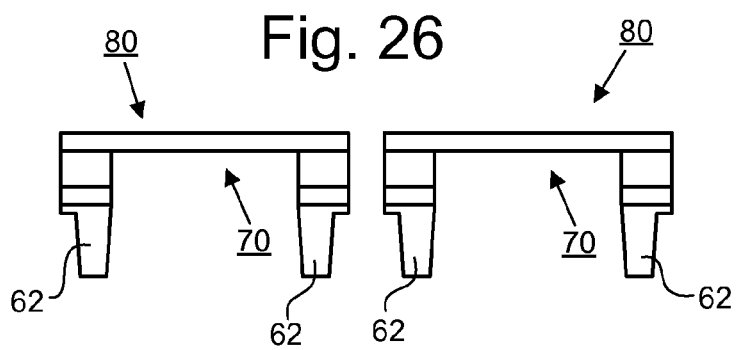

The membrane assembly 80 shown in FIGS. 23 and 24 is processed to form plural membrane assemblies 80 by removing the lower etch barrier 44 and upper etch barrier 46 and breaking the bridges separating the individual membrane assemblies 80 along lines 78 (see FIG. 25). The edge section is thereby separated from each of the borders. FIG. 26 shows as an example two membrane assemblies 80 formed after breaking along the lines 78 shown in FIG. 25. The bridges may be broken for example as described above with reference to FIG. 11.

According to the above embodiment the membrane assemblies 80 are separated relatively late, after removal of all layers in the membrane 70 except the at least one membrane layer 42 and, where provided, the lower capping film 47 and the upper capping film 48. This approach enables a large proportion of the manufacturing process to be perform using handling apparatus suitable for handling objects of the same size as the original planar substrate 40. This reduces cost where the original planar substrate 40 is a standard silicon wafer size.

In contrast to the methods described with reference to FIGS. 3-18, in the present embodiment the separation of the edge section from the borders is performed after removing the protection layer 72. This is not essential. The method may be adapted to perform the separation before removing the protection layer 72. An advantage of performing the separation prior to removing the protection layer 72 is that any debris or flakes produced by the separation process will be deposited on the protection layer 72 rather than on the at least one membrane layer 42. The debris or flakes may therefore be more easily removed. An advantage of performing the separation after removing the protection layer 72 is that the separation may be performed more easily because it is not necessary to cut through or break the protection layer 72. The absence of the protection layer 72 at this stage may reduce the amount of debris or flakes that is/are produced.

The inventors have found that forming a membrane assembly 80 using a bridge in which the planar substrate 40 is not completely etched through (e.g. such that a second portion 63B of the bridge region 63 remains) reduces a fragility at the edges of the membrane assembly 80 and reduces or avoids generation of debris or flakes. It is believed the reduction in fragility is related to reducing a thinning of material of the planar substrate 40 where the side surfaces of the planar substrate 40 meet the top surface of the planar substrate 40. Etching tends to progress at an oblique angle relative to the vertical direction (e.g. about 54 degrees). When the etching is allowed to progress completely through the planar substrate 40, the oblique angle provides a thin, wedge-like shape where the side surfaces meet the top surface. Where the bridge is not completely etched through, this thinning is reduced or avoided. For example, where breaking of the bridge involves splitting along a near vertical line, the side surfaces meet the top surface at approximately 90 degrees and no thinning occurs (except the thinning associated with the removal of the first portion 63A of the bridge region 63).

FIGS. 27-33 depict stages in a method of manufacturing a membrane assembly 80 according to an alternative embodiment. In this embodiment a stack 60 is provided. The stack 60 comprises a planar substrate 40 and at least one membrane layer 42. A sequence of layers may be provided in order from the planar substrate 40 outwards: a lower sacrificial layer 76, a lower etch barrier 44, at least one membrane layer 42, and an upper etch barrier 46. The lower etch barrier 44, at least one membrane layer 42 and upper etch barrier 46 may be formed for example as described above with reference to FIGS. 3-18. The stack 60 may optionally further comprise either or both of a lower capping film 47 and an upper capping film 48 around the at least one membrane layer 42, optionally formed as described above with reference to FIGS. 3-18.

The planar substrate 40 comprises an inner region 61, a border region 62 around the inner region 61, a bridge region 63 around the border region 62 and an edge region 64 around the border region 63.

Figure 27:
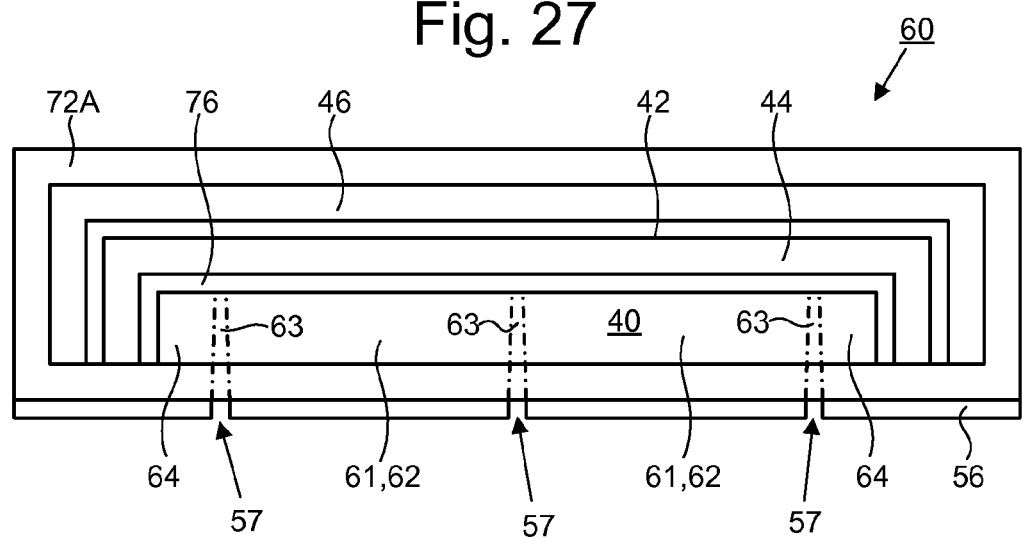
FIG. 27 schematically depicts a stage in a manufacturing process in which a bridge region of the planar substrate is etched away at an earlier stage than the inner region of the planar substrate.

A first protection layer 72A is provided over at least a top surface of the stack 60. The at least one membrane layer 42 is between the first protection layer 72A and the planar substrate 40. The first protection layer 72A is also provided over side surfaces of the stack 60. An example of such an arrangement is shown in FIG. 27. The first protection layer 72A may have the same composition for example as the protection layer 72 described above with reference to FIGS. 3-26. In an embodiment the first protection layer 72A comprises silicon nitride. The silicon nitride may be deposited using LPCVD or PECVD. The thickness of the silicon nitride may be in the range of 10 nm to 150 nm, optionally in the region of 100 nm.

A first removal process is applied to the stack 60 and first protection layer 72A to selectively remove at least a portion of the bridge region 63 of the planar substrate 40. An integral connection between the border region 62 and the edge region 64 is thereby thinned or removed. The first protection layer 72A is resistant to the first removal process. The first removal process may be the same as, or different from, the removal process for removing the protection layer 72 described above with reference to FIGS. 3-26.

In an embodiment the first removal process comprises forming a patterned KOH or TMAH etch barrier 56 on the bottom of the stack 60 to form the stack 60 depicted in FIG. 27. The processing may for example comprise use of a mask and photoresist layer, followed by developing, stripping, and dry and wet etching, as described above with reference to FIGS. 7 and 8.

Figure 28:
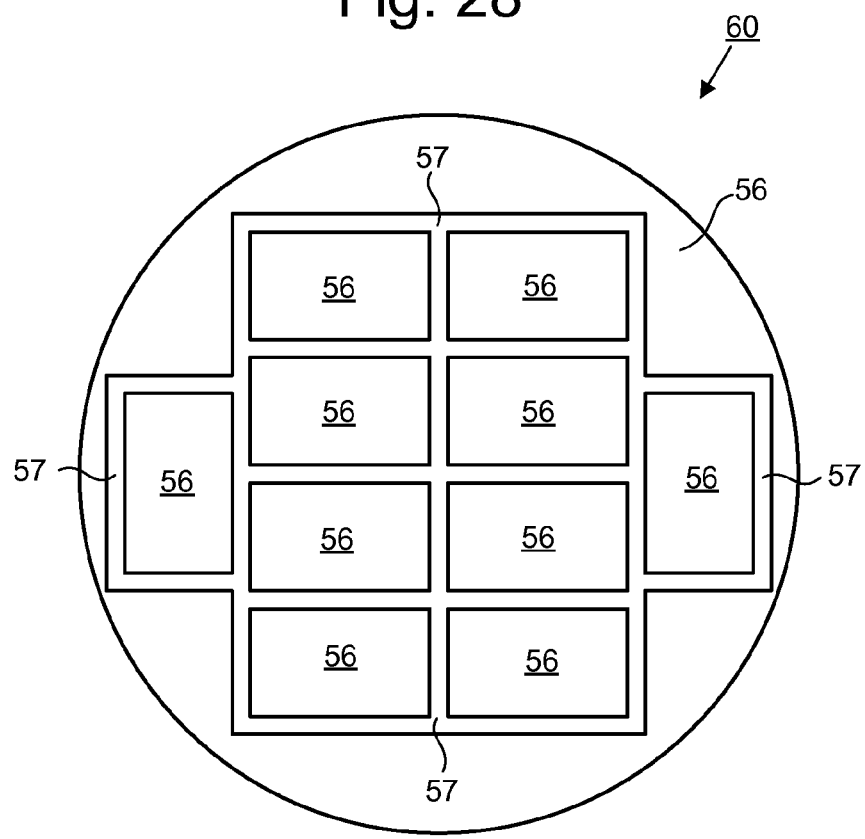
FIG. 28 is a schematic bottom view of the arrangement shown in FIG. 27.

FIG. 28 is a schematic bottom view of the stack 60 shown in FIG. 27. Plural regions 56, which each protect an overlying inner region 61 and border region 62, are each surrounded by a narrow gap 57 defining where an etchant can access and at least partially remove a bridge region 63. After the at least partial removal of the bridge region 63 the edge region 64 and layers formed on the edge region 64 can be removed, thereby forming a plurality of separated stacks 61. It is not essential for plural separated stacks 61 to be produced. In other embodiments the initial planar substrate 40 may yield only a single stack 60 after removal of the edge region 64 (e.g. by cutting through or breaking any remaining portion of the bridge region 63 and layers formed on the bridge region 63) and layers formed on the edge region 46 (e.g. where the size of the membrane assembly 80 to be formed is relatively large, for example of a similar order of size to the initial planar substrate 40).

Figure 29:
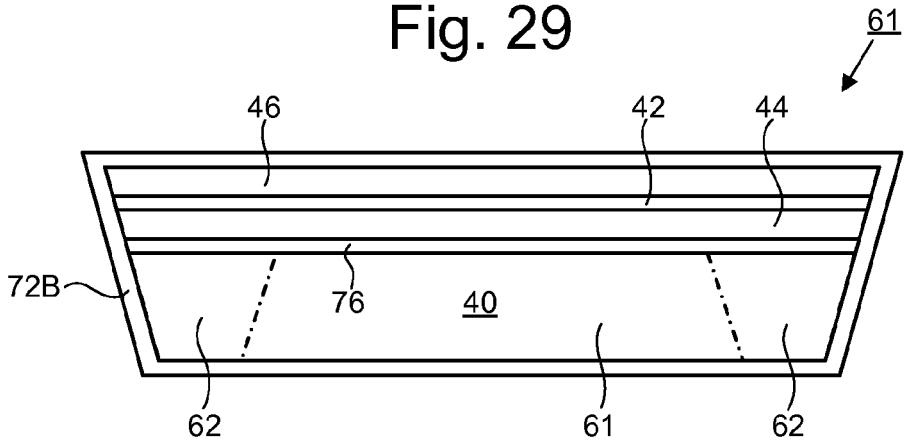
FIGS. 29 to 33 show further stages in the method of manufacture of FIGS. 27 and 28, after separation of an edge region of the planar substrate.

FIG. 29 shows one of the separated stacks 61 after application of a second protection layer 72B over at least side surfaces of the substrate assembly after removal of the edge region 64. The combination of any remaining portions of the first protection layer 72A together with the second protection layer 72B fully encapsulate the separated stack 61 at this stage. FIG. 29 includes dot chain lines to show locations of the inner region 61 and border region 62 within the planar substrate 40. The second protection layer 72B may have the same composition as, or a different composition to, the first protection layer 72A. In an embodiment the second protection layer 72B comprises silicon nitride. The silicon nitride may be deposited using LPCVD or PECVD. The thickness of the silicon nitride may be in the range of 10 nm to 150 nm, optionally in the region of 100 nm.

Figure 30:
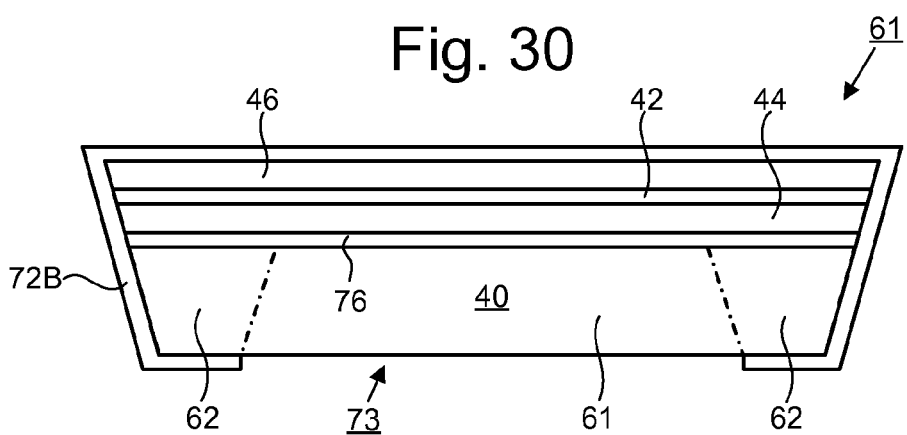

A second removal process is applied to selectively remove the inner region 61. The second protection layer 72B is resistant to the second removal process. The selective removal may be achieved by selectively removing the first or second protection layer 72A, 72B so as to form an opening 73 in the first or second protection layer 72A, 72B as shown in FIG. 30. In an embodiment the opening 73 is formed using lithography and a dry etch. The second removal process may be the same as, or different to, the first removal process. In an embodiment, the second removal process comprises a KOH or TMAH etch.

Figure 31:
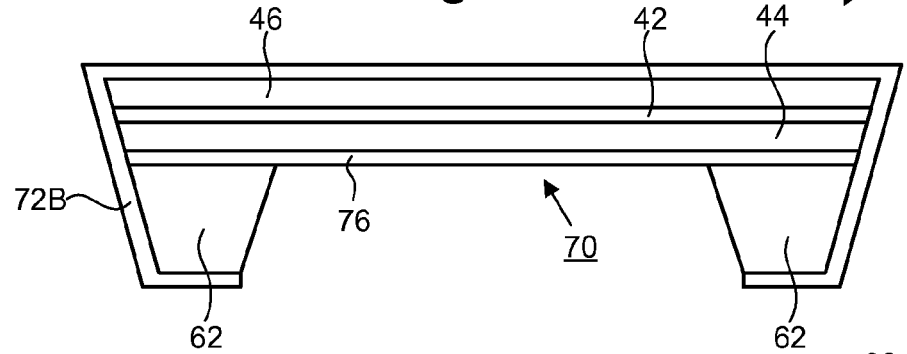

Removal of the inner region 61 forms a membrane assembly 80. An example of such a membrane assembly 80 is shown in FIG. 31. The membrane assembly 80 comprises a membrane 70 formed from the at least one membrane layer 42. The membrane assembly 80 further comprises a border holding the membrane 70. The border is formed from the border region 62 of the planar substrate 40.

Figure 32:
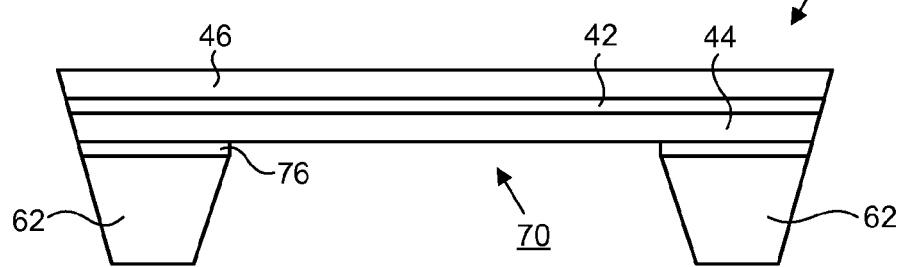

The membrane assembly 80 may be further processed to remove the first and second protection layers 72A, 72B (see FIG. 32). The first and second protection layers 72A and 72B may be removed using a wet etch for example.

Figure 33:
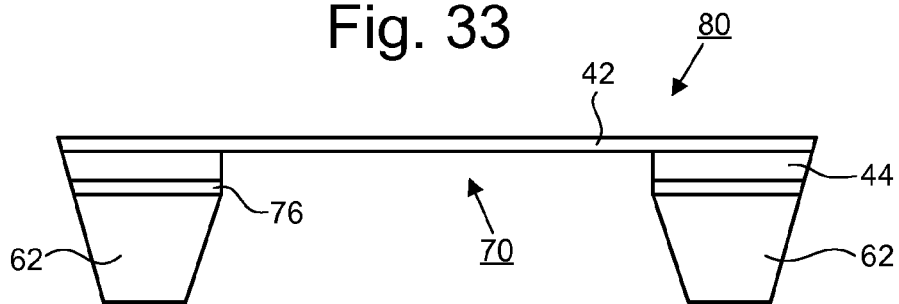

The membrane assembly 80 may be further processed to remove the lower etch barrier 44 and the upper etch barrier 46 (see FIG. 33). The lower etch barrier 44 and upper etch barrier 46 may be removed using a wet etch for example.

The membrane assembly 80 may be further processed to remove any remaining sacrificial layers (e.g. amorphous silicon layers). The remaining sacrificial layers may be removed using a wet etch for example.

In embodiments of the type shown in FIGS. 27-33 individual membrane assemblies 80 can be separated out (e.g. cut out) from the planar substrate 40 using etching. It is easier to provide smooth side walls using etching than using alternative separation processes such as laser cutting. Providing smoother side walls facilitates efficient and reliable application of protection layers (such as the second protection layer 72B).

FIGS. 34-39 depict stages in a method of manufacturing a membrane assembly 80 according to an alternative embodiment. In this embodiment a stack 60 is provided. The stack 60 comprises a planar substrate 40 and at least one membrane layer 42. A sequence of layers may be provided in order from the planar substrate 40 outwards: a lower sacrificial layer, a lower etch barrier 44, at least one membrane layer 42, and an upper etch barrier 46. The lower etch barrier 44, at least one membrane layer 42 and upper etch barrier 46 may be formed for example as described above with reference to FIGS. 3-18. The stack 60 may optionally further comprise either or both of a lower capping film 47 and an upper capping film 48 around the at least one membrane layer 42, optionally formed as described above with reference to FIGS. 3-18. The bottom side of the stack 60 is etched away up to a bottom side of the planar substrate 40. The processing may comprise multiple consecutive wet and dry etching steps including top side protection to etch away the layers on the bottom of the stack 60. The stack 60 may be formed for example as described above with reference to FIG. 5 or FIG. 20.

In an embodiment the stack 60 is encapsulated with an etch resistant coating 82. The etch resistant coating 82 is patterned on a bottom side of the stack 60 to define regions of the stack 60 that are protected from an etch removal process and regions of the stack 60 that are not protected from the etch removal process. The processing may for example comprise use of a mask and photoresist layer, followed by developing, stripping, and dry and wet etching, as described above with reference to FIGS. 7 and 8. In an embodiment the etch removal process is a KOH or TMAH etch and the etch resistant coating 82 has the same composition as the KOH or TMAH etch barrier 56 described above. In an embodiment the etch resistant coating 82 comprises silicon nitride. In an embodiment a nitride dry etch is applied to form the patterning on the bottom side of the stack 60.

Figure 34:
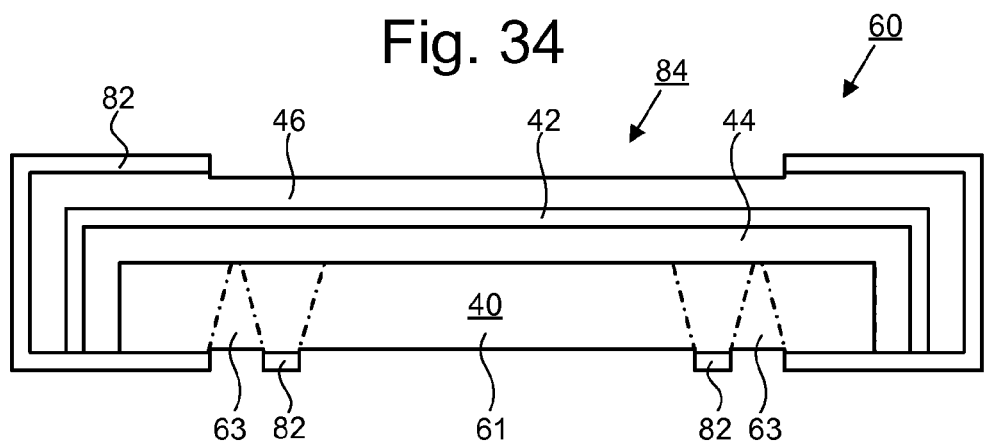

A mechanical polishing step is applied to a region on a top side of the stack 60 above the inner region 61, border region 62 and bridge region 63 of the planar substrate 40 to remove a first portion of the etch resistant coating 82. Mechanical polishing steps may be more effective for removing relatively large debris or flakes, in comparison with etching alone. An etching process effective for etching the etch resistant layer 82 is applied subsequently to the region on the top side of the stack 60 above the inner region 61, border region 62 and bridge region 63 of the planar substrate 40 to remove a second portion of the etch resistant coating 82. The second portion was below the first portion. The resulting arrangement is shown in FIG. 34. Opening 84 in the etch resistant coating 82 is where the first portion and second portion of the etch resistant coating 82 were located prior to being removed.

Figure 35:
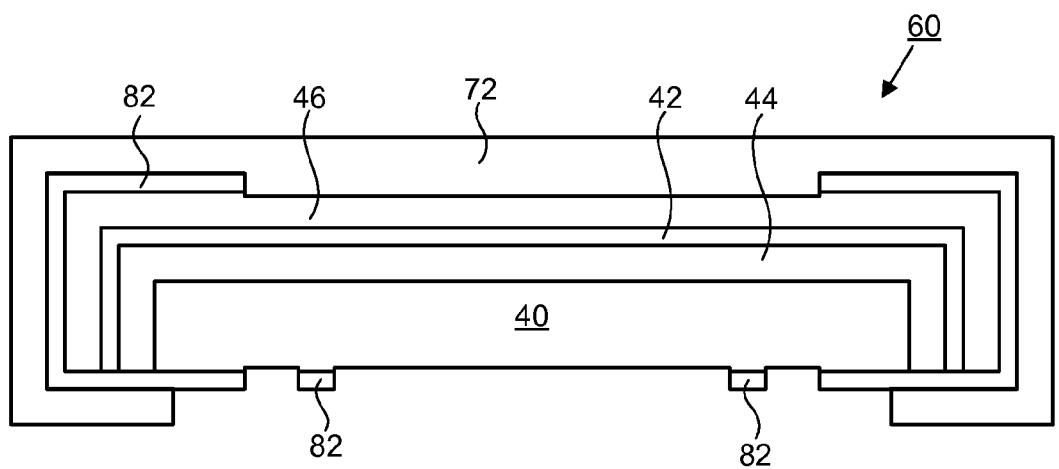

A protection layer 72 is applied subsequently to the stack 60 on at least the top of the stack 60, and optionally the side surfaces of the stack 60 (see FIG. 35). The protection layer 72 may have a composition for example as described above with reference to FIGS. 3-26.

A removal process is applied to selectively remove the inner region 61 and at least a portion of the bridge region 63, thereby thinning or removing an integral connection between the border region 62 and the edge region 64 of the planar substrate 40 to form the membrane assembly 80 shown in FIG. 36. The removal process may comprise a KOH or TMAH etch for example. The protection layer 72 provides mechanical strength sufficient to allow cleaning processes to be applied more easily and/or with less risk of breakage of the stack or generation of debris or flakes.

In a subsequent step the protection layer 72 is removed to provide the arrangement shown in FIG. 37. The lower etch barrier 44 and the upper etch barrier 46 are resistant to the removal process used to remove the protection layer 72 and protect the at least one membrane layer 42 from damage by the removal process.

In a subsequent step, the edge section is separated from the border by cutting or breaking the bridge, to provide the arrangement shown in FIG. 38. The removal of the first portion and second portion of the etch resistant coating 82 above the inner region 61, border region 62 and bridge region 63 facilitates cutting or breaking the bridge and reduces generation of debris or flakes at this stage.

In a subsequent step the lower etch barrier 44 and upper etch barrier 46 are removed to provide the membrane assembly 80 shown in FIG. 39.

FIGS. 61-67 depict further alternative processing flows for manufacturing a membrane assembly 80. As shown for example in FIGS. 61 and 64, in embodiments of this type a stack 60 is provided comprising a planar substrate 40 and at least one membrane layer 42. The planar substrate 40 comprises an inner region 61, a border region 62 around the inner region 61, and an edge region 64 around the border region 62.

Subsequently, the edge region 64 (and any layers formed on or under the edge region 64) may be removed. This process may be referred to as dicing.

After the removal of the edge region 64, a protection layer 72 is applied over at least a top surface of the stack, such that the at least one membrane layer 42 is between the protection layer 72 and the planar substrate 40, and over side surfaces of the stack 60. A variation on this method in which the protection layer 72 is applied before removal of the edge region is described above with reference to FIGS. 47-50.

Subsequently, a removal process is used to selectively remove the inner region 61. The protection layer 72 is resistant to the removal process. Examples of the result of processing to this stage are shown in FIGS. 62 and 65.

Subsequently, the protection layer 72 is removed to provide a membrane assembly 80 comprising a membrane 70 formed from the at least one membrane layer 42. The membrane assembly 80 comprises a border holding the membrane 70. The border is formed from the border region 62 of the planar substrate 40. Examples of the result of processing to this stage are shown in FIGS. 63 and 67.

Further details about example processing flows are now provided with reference to FIGS. 61-63 and FIGS. 64-67. In both examples, the separation of the inner region 61 and border region 62 of the planar substrate 40 from the edge region 64 is performed while the at least one membrane layer 42 is surrounded above and below by at least an upper etch barrier 46 and a lower etch barrier 44. The at least one membrane layer 42 is protected by the upper etch bather 46 and the lower etch barrier 44.

Starting from the arrangement shown in FIG. 5, processing to form the stack 60 shown in FIG. 61 is performed. An etch barrier 56 is applied on the bottom of the stack 60 (e.g. a KOH or TMAH etch barrier). The etch barrier 56 is subsequently patterned and processed to perform an opening, for example in a manner analogous to the process described above with reference to FIGS. 7 and 8.

Subsequently, the stack 60 is diced (shown by dot-chain lines 114 in FIG. 61) to separate the inner region 61 and border region 62 of the planar substrate 40 from the edge region 64. A protection layer 72 is then provided over the top surface, over the side surfaces, and over a peripheral portion of the bottom surface of the stack 60. The opening formed by the patterning in the etch bather 56 is not covered by the protection layer 72. The protection layer 72 is resistant to a removal process used for selectively removing the inner region 61 of the planar substrate 40 and may have any of the compositions for the protection layer 72 described above (e.g. Parylene). The removal process for selectively removing the inner region 61 of the planar substrate 40 is then applied. The lower etch barrier 44 on the bottom side of the membrane layer 42 is also removed (e.g. using wet etching). The membrane assembly 80 shown in FIG. 62 is thereby provided.

Subsequently, the protection layer 72 is removed. The protection layer 72 may be removed using any of the methods for removing the protection layer 72 described above (e.g. intense oxygen plasma treatment).

Subsequently, the upper etch barrier 46 is removed (e.g. by wet etching) to produce the membrane assembly 80 shown in FIG. 63.

A variation on the method described with reference to FIGS. 61-63 is described below with reference to FIGS. 64-67. In this variation, the processing described above for forming the stack 60 shown in FIG. 56 is varied so that the patterning of the etch barrier 56 has the same form as the patterning of the etch bather 56 shown in FIG. 61. The patterning thereby defines a single opening for allowing removal of the inner region 61 of the planar substrate 40 rather than multiple openings to allow also removal of all or part of a bridge region 63. The stack 60 shown in FIG. 64 is thereby provided.

Subsequently, the stack 60 is diced (shown by dot-chain lines 114 in FIG. 64) to separate the inner region 61 and border region 62 of the planar substrate 40 from the edge region 64. A protection layer 72 is then provided over the top surface, over the side surfaces, and over a peripheral portion of the bottom surface of the stack 60. The opening formed by the patterning in the etch bather 56 is not covered by the protection layer 72. The protection layer 72 is resistant to a removal process used for selectively removing the inner region 61 of the planar substrate 40 and may have any of the compositions for the protection layer 72 described above (e.g. Parylene). The removal process for selectively removing the inner region 61 of the planar substrate 40 is then performed. The membrane assembly 80 shown in FIG. 65 is thereby provided.

Subsequently, the protection layer 72 is removed to provide the membrane assembly 80 shown in FIG. 66. The protection layer 72 may be removed using any of the methods for removing the protection layer 72 described above (e.g. intense oxygen plasma treatment).

Subsequently, the lower sacrificial layer 76, lower etch barrier 44, upper etch barrier 46, and the etch barrier 56 are removed (e.g. by wet etching) to form the membrane assembly 80 shown in FIG. 67.

In an embodiment, the membrane assembly 80 can be used as a pellicle placed in front of the patterning device MA and thus protect the patterning device MA. An embodiment of the invention is expected to achieve a reduction of fragility of a pellicle. An embodiment of the invention is expected to make it easier to produce membrane assemblies in high volume. An embodiment of the invention is expected to enable the processing of a free standing membrane integrated in a frame.

In an embodiment the membrane assembly 80 is configured to transmit at least 80%, optionally at least 90% of radiation having a wavelength of 13.5 nm. In an embodiment the membrane assembly 80 is configured to transmit less than 5% of DUV radiation (approximately 100-400 nm).

Embodiments are described in the following numbered clauses:

1. A method of manufacturing a membrane assembly for EUV lithography, the method comprising:
   providing a stack comprising a planar substrate and at least one membrane layer, wherein the planar substrate comprises an inner region, a border region around the inner region, a bridge region around the border region and an edge region around the bridge region;
   selectively removing the inner region and a first portion of the bridge region to provide a membrane assembly comprising:

a membrane formed from the at least one membrane layer;
a border holding the membrane, the border formed from the border region of the planar substrate;
an edge section around the border, the edge section formed from the edge region of the planar substrate; and
a bridge between the border and the edge section, the bridge formed from the at least one membrane layer and a second portion of the bridge region of the planar substrate; and
separating the edge section from the border by cutting or breaking the bridge.

2. The method of clause 1, wherein the bridge is broken by applying a mechanical stress to the membrane assembly.

3. The method of clause 1, wherein the bridge is cut through using a laser.

4. The method of any preceding clause, wherein the stack further comprises:
a protection layer over at least a top surface of the stack, such that the at least one membrane layer is between the protection layer and the planar substrate, and over side surfaces of the stack, the protection layer being resistant to a removal process used for selectively removing the inner region and the first portion of the bridge region;
an upper etch barrier between the at least one membrane layer and the protection layer and a lower etch barrier between the at least one membrane layer and the planar substrate, wherein:
the method further comprises removing the protection layer after the inner region and the first portion of the bridge region have been removed and at least the upper etch barrier is resistant to a removal process used to remove the protection layer.

5. The method of clause 4, further comprising removing the protection layer and a portion of the upper etch barrier and a portion of the lower etch barrier that together sandwich a portion of the at least one membrane layer.

6. A method of manufacturing a membrane assembly for EUV lithography, the method comprising:
providing a stack comprising a planar substrate and at least one membrane layer, wherein the planar substrate comprises an inner region, a border region around the inner region, a bridge region around the border region and an edge region around the border region;
applying a first protection layer over at least a top surface of the stack, such that the at least one membrane layer is between the first protection layer and the planar substrate, and over side surfaces of the stack;
applying a first removal process to the stack and first protection layer to selectively remove at least a portion of the bridge region of the planar substrate, thereby thinning or removing an integral connection between the border region and the edge region of the planar substrate, the first protection layer being resistant to the first removal process;
removing the edge region and layers formed on the edge region;
applying a second protection layer over at least side surfaces of the substrate assembly after removal of the edge region;
applying a second removal process to selectively remove the inner region, the second protection layer being resistant to the second removal process, to provide a membrane assembly comprising:
a membrane formed from the at least one membrane layer; and
a border holding the membrane, the border formed from the border region of the planar substrate.

7. The method of clause 6, wherein:
the stack further comprises an upper etch barrier and a lower etch barrier, the at least one membrane layer being located between the upper etch barrier and the lower etch barrier; and
the method further comprises removing the second protection layer after the inner region has been removed and at least the upper etch barrier is resistant to a removal process used to remove the second protection layer.

8. The method of clause 7, further comprising removing a portion of the upper etch barrier and a portion of the lower etch barrier that together sandwich a portion of the at least one membrane layer.

9. A method of manufacturing a membrane assembly for EUV lithography, the method comprising:
providing a stack comprising a planar substrate, at least one membrane layer and a protection layer, the at least one membrane layer being between the protection layer and the planar substrate, wherein the planar substrate comprises an inner region, a border region around the inner region, a bridge region around the border region and an edge region around the bridge region;
using a removal process to selectively remove the inner region and at least a portion of the bridge region, thereby thinning or removing an integral connection between the border region and the edge region of the planar substrate, the protection layer being resistant to the removal process; and
separating the edge region and layers formed on the edge region from the substrate assembly and, subsequently, removing the protection layer, to provide a membrane assembly comprising:
a membrane formed from the at least one membrane layer; and
a border holding the membrane, the border formed from the border region of the planar substrate.

10. The method of clause 9, wherein the stack further comprises an upper etch barrier between the at least one membrane layer and the protection layer and a lower etch barrier between the at least one membrane layer and the planar substrate, wherein at least the upper etch barrier is resistant to a removal process used to remove the protection layer.

11. The method of clause 10, further comprising removing a portion of the upper etch barrier and a portion of the lower etch barrier that together sandwich a portion of the at least one membrane layer.

12. A method of manufacturing a membrane assembly for EUV lithography, the method comprising:
providing a stack comprising a planar substrate and at least one membrane layer, wherein the planar substrate comprises an inner region, a border region around the inner region, and an edge region around the border region;
removing the edge region and layers formed on the edge region;
applying a protection layer over at least a top surface of the stack, such that the at least one membrane layer is between the protection layer and the planar substrate, and over side surfaces of the stack;

using a first removal process to selectively remove the inner region, the protection layer being resistant to the first removal process; and using a second removal process to remove the protection layer, to provide a membrane assembly comprising:
- a membrane formed from the at least one membrane layer; and
- a border holding the membrane, the border formed from the border region of the planar substrate.

13. The method of clause 12, wherein the applying of the protection layer is performed after removal of the edge region.

14. The method of clause 12, wherein the applying of the protection layer is performed before removal of the edge region.

15. The method of any of clauses 12-14, wherein the stack further comprises an upper etch barrier, the protection layer being applied such that the upper etch barrier is between the at least one membrane layer and the protection layer, and a lower etch barrier between the at least one membrane layer and the planar substrate, wherein at least the upper etch barrier is resistant to the second removal process used to remove the protection layer.

16. The method of clause 15, further comprising removing a portion of the upper etch barrier and a portion of the lower etch barrier that together sandwich a portion of the at least one membrane layer.

17. A method of manufacturing a membrane assembly for EUV lithography, the method comprising:
providing a stack comprising a planar substrate and at least one membrane layer, wherein the planar substrate comprises an inner region, a border region around the inner region, a bridge region around the border region and an edge region around the bridge region;
encapsulating the stack with an etch resistant coating and patterning the etch resistant coating on a bottom side of the stack to define regions of the stack that are protected by the etch resistant coating and regions of the stack that are not protected by the etch resistant coating;
applying a mechanical polishing process to a region on a top side of the stack above the inner region, border region and bridge region of the planar substrate to remove a first portion of the etch resistant coating;
applying an etching process effective to etch the etch resistant coating to the region on the top side of the stack above the inner region, border region and bridge region of the planar substrate to remove a second portion of the etch resistant coating;
applying a protection layer covering at least the top side of the stack; and
using a removal process to selectively remove the inner region and at least a portion of the bridge region, thereby thinning or removing an integral connection between the border region and the edge region of the planar substrate, to provide a membrane assembly comprising:
- a membrane formed from the at least one membrane layer;
- a border holding the membrane, the border formed from the border region of the planar substrate;
- an edge section around the border, the edge section formed from the edge region of the planar substrate; and
- a bridge between the border and the edge section, the bridge formed from the at least one membrane layer and any remaining portion of the bridge region of the planar substrate; and separating the edge section from the border by cutting or breaking the bridge.

18. The method of clause 17, wherein:
the stack further comprises an upper etch barrier and a lower etch barrier, the at least one membrane layer being located between the upper etch barrier and the lower etch barrier; and
the method further comprises removing the protection layer after the inner region has been removed and at least the upper etch barrier is resistant to a removal process used to remove the protection layer.

19. The method of clause 18, further comprising removing a portion of the upper etch barrier and a portion of the lower etch barrier that together sandwich a portion of the at least one membrane layer.

20. The method of any of clauses 4, 5, 7, 8, 10, 11, 15, 16, and 18-19, wherein the upper etch barrier comprises a plurality of layers of different composition and a thickest of the plurality of layers comprises tetraethylorthosilicate (TEOS) formed using low-pressure chemical vapor deposition or plasma-enhanced chemical vapor deposition.

21. The method of any of clauses 4, 5, 7, 8, 10, 11, 15, 16, and 18-20, wherein the lower etch barrier comprises a plurality of layers of different composition and a thickest of the plurality of layers comprises tetraethylorthosilicate (TEOS) formed using low-pressure chemical vapor deposition or plasma-enhanced chemical vapor deposition.

22. The method of any of clauses 4, 5, 7, 8, 10, 11, 15, 16, and 18-21, wherein the upper etch barrier and lower etch barrier are each directly adjacent to the at least one membrane layer and are each configured to apply substantially equal tensile or compressive forces to the at least one membrane layer.

23. The method of any preceding clause, wherein the planar substrate comprises a silicon wafer.

24. The method of any preceding clause, wherein the at least one membrane layer comprises a layer of amorphous silicon.

25. The method of clause 24, wherein the at least one membrane layer further comprises a silicon nitride layer on each side of the amorphous silicon layer.

26. The method of any preceding clause, wherein the membrane is at least 80% transparent to radiation having a wavelength of 13.5 nm.

27. The method of any preceding clause, wherein the protection layer or, where applicable, the first protection layer or the second protection layer comprises one or more of the following: an organic polymer layer, and a nitride layer formed using low-pressure chemical vapor deposition or plasma-enhanced chemical vapor deposition.

28. The method of any preceding clause, wherein the membrane assembly is for a patterning device or a dynamic gas lock.

29. A membrane assembly obtainable or obtained by the manufacturing method of any of the preceding clauses.

30. A lithographic apparatus comprising:
a patterning device configured to impart a pattern to a beam of radiation; and
a pellicle comprising a membrane assembly manufactured by the method of any of clauses 1-28 and configured to protect the patterning device.

31. A device manufacturing method comprising using the lithographic apparatus of clause 30 to manufacture a device using lithography.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, LCDs, thin-film magnetic heads, etc. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

While specific embodiments of the invention have been described above, it will be appreciated that the invention may be practiced otherwise than as described. For example, the various lacquer layers may be replaced by non-lacquer layers that perform the same function.

The descriptions above are intended to be illustrative, not limiting. Thus it will be apparent to one skilled in the art that modifications may be made to the invention as described without departing from the scope of the claims set out below.

The invention claimed is:

1. A method of manufacturing a membrane assembly for EUV lithography, the method comprising:
   providing a stack comprising a planar substrate and at least one membrane layer, wherein the planar substrate comprises an inner region, a border region around the inner region, a bridge region around the border region and an edge region around the bridge region;
   selectively removing the inner region and a first portion of the bridge region to provide a membrane assembly comprising:
      a membrane formed from the at least one membrane layer,
      a border holding the membrane, the border formed from the border region of the planar substrate,
      an edge section around the border, the edge section formed from the edge region of the planar substrate, and
      a bridge between the border and the edge section, the bridge formed from the at least one membrane layer and a second portion of the bridge region of the planar substrate; and
   separating the edge section from the border by cutting or breaking the bridge.

2. The method of claim 1, wherein the stack further comprises:
   a protection layer over at least a top surface of the stack, such that the at least one membrane layer is between the protection layer and the planar substrate, and over side surfaces of the stack, the protection layer being resistant to a removal process used for selectively removing the inner region and the first portion of the bridge region;
   an upper etch barrier between the at least one membrane layer and the protection layer and a lower etch barrier between the at least one membrane layer and the planar substrate, wherein:
   the method further comprises removing the protection layer after the inner region and the first portion of the bridge region have been removed and at least the upper etch barrier is resistant to a removal process used to remove the protection layer.

3. The method of claim 2, further comprising removing a portion of the protection layer, a portion of the upper etch barrier and a portion of the lower etch barrier, that together sandwich a portion of the at least one membrane layer.

4. A method of manufacturing a membrane assembly for EUV lithography, the method comprising:
   providing a stack comprising a planar substrate and at least one membrane layer, wherein the planar substrate comprises an inner region, a border region around the inner region, a bridge region around the border region and an edge region around the border region and wherein the stack comprises a first protection layer over at least a top surface of the stack, such that the at least one membrane layer is between the first protection layer and the planar substrate, and over side surfaces of the stack;
   applying a first removal process to the stack and first protection layer to selectively remove at least a portion of the bridge region of the planar substrate, thereby thinning or removing an integral connection between the border region and the edge region of the planar substrate, the first protection layer being resistant to the first removal process;
   removing the edge region and any layers formed on the edge region;
   applying a second protection layer over at least side surfaces of the substrate assembly after removal of the edge region; and
   applying a second removal process to selectively remove the inner region, the second protection layer being resistant to the second removal process, to provide a membrane assembly comprising:
      a membrane formed from the at least one membrane layer, and
      a border holding the membrane, the border formed from the border region of the planar substrate.

5. The method of claim 4, wherein:
   the stack further comprises an upper etch barrier and a lower etch barrier, the at least one membrane layer being located between the upper etch barrier and the lower etch barrier; and
   the method further comprises removing the second protection layer after the inner region has been removed and at least the upper etch barrier is resistant to a removal process used to remove the second protection layer.

6. A method of manufacturing a membrane assembly for EUV lithography, the method comprising:
   providing a stack comprising a planar substrate, at least one membrane layer and a protection layer, the at least one membrane layer being between the protection layer and the planar substrate, wherein the planar substrate comprises an inner region, a border region around the inner region, a bridge region around the border region and an edge region around the bridge region;
   using a removal process to selectively remove the inner region and at least a portion of the bridge region, thereby thinning or removing an integral connection between the border region and the edge region of the planar substrate, the protection layer being resistant to the removal process; and
   separating the edge region and any layers formed on the edge region from the substrate assembly and, subsequently, removing the protection layer, to provide a membrane assembly comprising:
      a membrane formed from the at least one membrane layer, and
      a border holding the membrane, the border formed from the border region of the planar substrate.

7. The method of claim 6, wherein the stack further comprises an upper etch barrier between the at least one membrane layer and the protection layer and a lower etch barrier between the at least one membrane layer and the planar substrate, wherein at least the upper etch barrier is resistant to a removal process used to remove the protection layer.

8. A method of manufacturing a membrane assembly for EUV lithography, the method comprising:
   providing a stack comprising a planar substrate and at least one membrane layer, wherein the planar substrate comprises an inner region, a border region around the inner region, and an edge region around the border region;
   removing the edge region and any layers formed on the edge region;
   applying a protection layer over at least a top surface of the stack, such that the at least one membrane layer is between the protection layer and the planar substrate, and over side surfaces of the stack;
   using a first removal process to selectively remove the inner region, the protection layer being resistant to the first removal process; and
   using a second removal process to remove the protection layer, to provide a membrane assembly comprising:
      a membrane formed from the at least one membrane layer, and
      a border holding the membrane, the border formed from the border region of the planar substrate.

9. The method of claim 8, wherein the stack further comprises an upper etch barrier, the protection layer being applied such that the upper etch barrier is between the at least one membrane layer and the protection layer, and a lower etch barrier between the at least one membrane layer and the planar substrate, wherein at least the upper etch barrier is resistant to the second removal process used to remove the protection layer.

10. A method of manufacturing a membrane assembly for EUV lithography, the method comprising:
   providing a stack comprising a planar substrate and at least one membrane layer, wherein the planar substrate comprises an inner region, a border region around the inner region, a bridge region around the border region and an edge region around the bridge region and wherein the stack comprises an etch resistant coating on a top side and bottom side of the stack and the etch resistant coating on the bottom side of the stack defines regions of the stack that are protected by the etch resistant coating and regions of the stack that are not protected by the etch resistant coating;
   applying a mechanical polishing process to a region on a top side of the stack above the inner region, border region and bridge region of the planar substrate to remove a first portion of the etch resistant coating;
   applying an etching process, effective to etch the etch resistant coating, to the region on the top side of the stack above the inner region, border region and bridge region of the planar substrate to remove a second portion of the etch resistant coating;
   applying a protection layer covering at least the top side of the stack; and
   using a removal process to selectively remove the inner region and at least a portion of the bridge region, thereby thinning or removing an integral connection between the border region and the edge region of the planar substrate, to provide a membrane assembly comprising:
      a membrane formed from the at least one membrane layer,
      a border holding the membrane, the border formed from the border region of the planar substrate,
      an edge section around the border, the edge section formed from the edge region of the planar substrate, and
      a bridge between the border and the edge section, the bridge formed from the at least one membrane layer and any remaining portion of the bridge region of the planar substrate; and
   separating the edge section from the border by cutting or breaking the bridge.

11. The method of claim 10, wherein:
   the stack further comprises an upper etch barrier and a lower etch barrier, the at least one membrane layer being located between the upper etch barrier and the lower etch barrier; and
   the method further comprises removing the protection layer after the inner region has been removed and at least the upper etch barrier is resistant to a removal process used to remove the protection layer.

12. The method of claim 2, wherein the upper etch barrier and/or lower etch barrier comprises a plurality of layers of different composition and a thickest of the plurality of layers comprises tetraethylorthosilicate (TEOS) formed using low-pressure chemical vapor deposition or plasma-enhanced chemical vapor deposition.

13. The method of claim 1, wherein the at least one membrane layer comprises a layer of amorphous silicon.

14. The method of claim 13, wherein the at least one membrane layer further comprises a silicon nitride layer on each side of the amorphous silicon layer.

15. The method of claim 1, wherein the membrane is at least 80% transparent to radiation having a wavelength of 13.5 nm.

16. The method of claim 2, wherein the protection layer comprises one or more selected from the following: an organic polymer layer, and/or a nitride layer formed using low-pressure chemical vapor deposition or plasma-enhanced chemical vapor deposition.

17. A membrane assembly obtainable or obtained by the manufacturing method of claim 1.

18. The method of claim 4, wherein the membrane is at least 80% transparent to radiation having a wavelength of 13.5 nm.

19. The method of claim 6, wherein the membrane is at least 80% transparent to radiation having a wavelength of 13.5 nm.

20. The method of claim 8, wherein the membrane is at least 80% transparent to radiation having a wavelength of 13.5 nm.

* * * * *